(12) United States Patent
Kuwabara

(10) Patent No.: US 6,501,089 B1
(45) Date of Patent: Dec. 31, 2002

(54) IMAGE DETECTOR, FABRICATION METHOD THEREOF, IMAGE RECORDING METHOD, IMAGE RECORDER, IMAGE READING METHOD, AND IMAGE READER

(75) Inventor: Takao Kuwabara, Kaisei-machi (JP)

(73) Assignee: Fuji Photo Film Co., Ltd., Kanagawa-Ken (JP)

( * ) Notice: Subject to any disclaimer, the term of this patent is extended or adjusted under 35 U.S.C. 154(b) by 10 days.

(21) Appl. No.: 09/641,966

(22) Filed: Aug. 21, 2000

(30) Foreign Application Priority Data

Aug. 19, 1999 (JP) .......................................... 11-232673

(51) Int. Cl.$^7$ ............................................. G01N 23/04
(52) U.S. Cl. ....................................... 250/591; 250/580
(58) Field of Search .................................. 250/591, 580, 250/370.09

(56) References Cited

U.S. PATENT DOCUMENTS

| | | | |
|---|---|---|---|
| 4,535,468 A | | 8/1985 | Kempter ........................ 378/31 |
| 4,857,723 A | | 8/1989 | Modisette .................... 250/213 |
| 5,017,989 A | * | 5/1991 | Street et al. ................... 357/30 |
| 5,196,702 A | * | 3/1993 | Tsuji et al. ................. 250/327.2 |
| 5,331,179 A | | 7/1994 | Lee et al. .................... 250/591 |
| 5,510,626 A | * | 4/1996 | Nelson et al. ............... 250/591 |
| 5,925,890 A | | 7/1999 | Van den Bogaert et al. 250/580 |
| 6,194,727 B1 | * | 2/2001 | Lee et al. ............... 250/370.09 |
| 6,310,358 B1 | * | 10/2001 | Zur ............................. 250/591 |

FOREIGN PATENT DOCUMENTS

| | | | | |
|---|---|---|---|---|
| JP | 6-217322 | 8/1994 | ............ | H04N/7/18 |
| JP | 7-72258 | 3/1995 | ............ | G01T/1/20 |
| JP | 7-116154 | 5/1995 | ............ | A61B/6/03 |
| JP | 5-5906 | 1/1997 | ............ | G03B/42/02 |
| JP | 10-232824 | 9/1998 | ............ | G06F/12/06 |
| JP | 10-271374 | 10/1998 | ............ | H04N/5/225 |

OTHER PUBLICATIONS

Patent Abstract of Japan 07072258 Mar. 17, 1995.
Patent Abstract of Japan 07116154 May 9, 1995.
Patent Abstract of Japan 10232824 Sep. 2, 1998.
Patent Abstract of Japan 10271374 Oct. 9, 1998.

* cited by examiner

*Primary Examiner*—Georgia Epps
*Assistant Examiner*—Richard Hanig
(74) *Attorney, Agent, or Firm*—Sughrue Mion, PLLC

(57) ABSTRACT

Disclosed herein is an image detector including a first stripe electrode, a photoconductive layer which exhibits photoconductivity when irradiated with recording light, a rectifying layer 14 having a large number of diodes, and a second stripe electrode, which are stacked in the recited order. The elements of the first stripe electrode and the elements of the second stripe electrode are disposed so that they cross approximately perpendicularly. Voltage is applied from a power source between both elements to store uniform electric charge in a charge storage portion. Then, recording light is irradiated through the side of the first stripe electrode so that the latent image charge stored in the charge storage portion disappears according to the dose of the recording light. During reading, a predetermined voltage is applied between each of the elements of the first stripe electrode and all the elements of the second stripe electrode. A charging current that flows in the image detector by the application of the predetermined voltage is detected by a charging-current detection circuit.

25 Claims, 17 Drawing Sheets

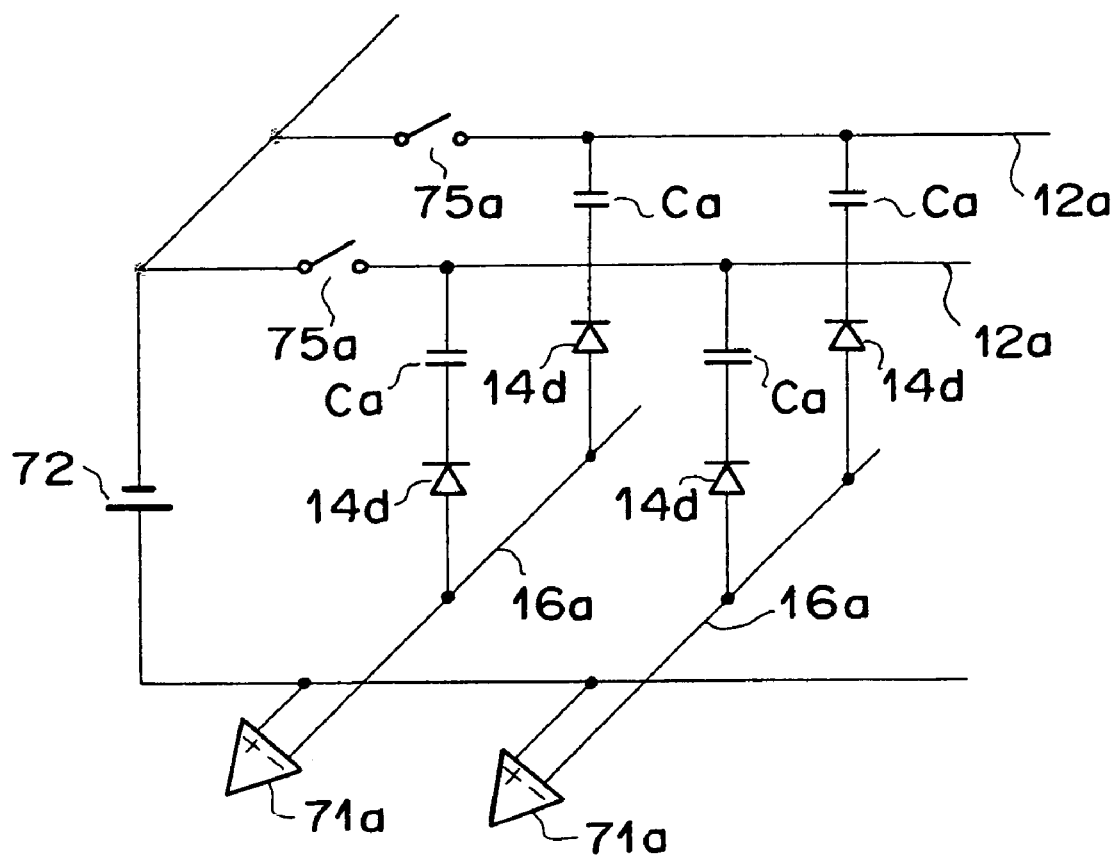
F I G . 4

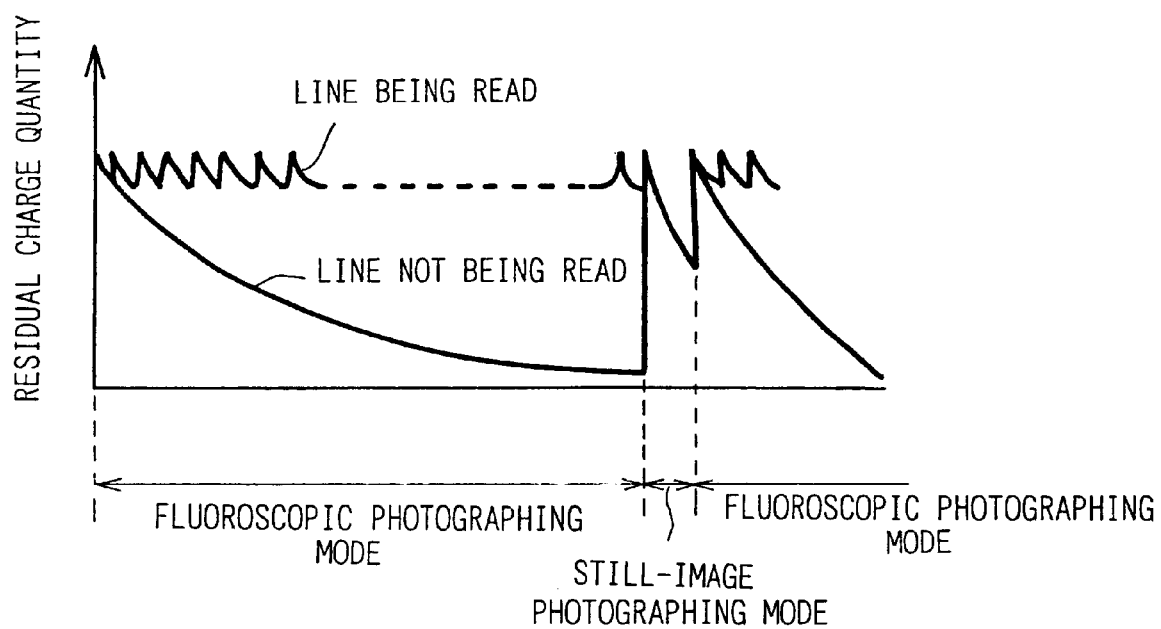
F I G . 17

IMAGE DETECTOR, FABRICATION METHOD THEREOF, IMAGE RECORDING METHOD, IMAGE RECORDER, IMAGE READING METHOD, AND IMAGE READER

BACKGROUND OF THE INVENTION

1. Field of the Invention

The present invention relates to a solid state radiation detector with a charge storage portion for storing an electric charge with a quantity corresponding to the dose of radiation irradiated, an image recording method and an image recorder for recording radiation image information on the charge storage portion as an electrostatic latent image by the use of the detector, and an image reading method and an image reader for reading out the recorded electrostatic latent image from the detector.

2. Description of the Related Art

Units, which employ an image detector, such as a facsimile, a copying machine, a radiation imaging unit, etc., are known.

For example, in the medical radiation imaging unit, for the purposes of a reduction in the radiation dose to which a subject is exposed, an enhancement in diagnosis performance, etc., a solid state radiation detector (electrostatic storage) with a photoconductor (layer) such as a selenium plate sensitive to radiation such as X-rays is employed as an image detector. X-rays are irradiated to the solid state radiation detector to store an electric charge with a quantity corresponding to the dose of the irradiated radiation in the charge storage portion of the detector as latent image charge. With the irradiation, radiation image information is recorded on the charge storage portion as an electrostatic latent image. The solid state radiation detector recorded with the radiation image information is scanned by a laser beam or a line light source to read out the radiation image information from the detector.(e.g., Japanese Unexamined Patent Publication No. 6(1994)-217322, U.S. Pat. No. 4,857,723, Japanese Unexamined Patent Publication No. 9(1997)-5906, etc.).

The method as described in the above-mentioned Japanese Unexamined Patent Publication No. 6(1994)-217322 uses, as an image detector, a solid state radiation detector in which (1) a conductive layer, (2) an X-ray photoconductive layer, (3) a dielectric layer, and (4) an electrode layer with a plurality of micro plates corresponding to pixels are stacked and also having a thin film transistor (TFT) connected to each micro plate. X-rays transmitted through a subject are irradiated to the solid state radiation detector to store latent image charge in a charge storage portion formed between each micro plate and the conductive layer. With the storage, the radiation image information is recorded in the solid state radiation detector. Next, the TFTs are scanned to read out the latent image charge stored in the charge storage portion from the solid state radiation detector. In this manner the radiation image information is read out from the solid state radiation detector.

The method as described in the above-mentioned U.S. Pat. No. 4,857,723 uses, as an image detector, a solid state radiation detector constructed so that both sides of a photoconductive layer are interposed between insulating layers and that the outsides of the insulating layers are interposed between stripe electrodes which have a plurality of line electrodes crossing one another. X-rays transmitted through a subject are irradiated to the solid state radiation detector to store latent image charges of opposite polarities in two charge storage portions formed at the interface between the photoconductive layer and the insulating layer, at the positions where both stripe electrodes cross. After the radiation image information is recorded in the solid state radiation detector, it is scanned with laser light (reading light) to read out the latent image charges stored in the charge storage portion from the solid state radiation detector. In this way the radiation image information is read out from the detector.

In the method as described in the above-mentioned Japanese Unexamined Patent Publication No. 9(1997)-5906, a solid state radiation detector, in which a trapping layer (first electrode layer), a reading photoconductive layer (recording photoconductive layer), and a second electrode layer (charge storage portion) are stacked in the recited order, is used as an image detector. With high voltage applied between electrodes disposed on both sides of the detector, uniform exposure light is irradiated to cause primary charging in the charge storage portion of the detector. Thereafter,both electrodes are short-circuited, or given high voltage, or made open circuit. With an electric field generated in the recording photoconductive layer, X-rays transmitted through a subject are irradiated to store latent image charge in the charge storage portion. After the radiation image information is recorded in the solid stage radiation detector, both electrodes are short-circuited. The solid stage radiation detector is scanned with laser light (reading light) to read out the latent image charge stored in the charge storage portion from the solid stage radiation detector. Thus, the radiation image information is read out from the detector.

However, method as described in the above-mentioned Japanese Unexamined Patent Publication No. 6(1994)-217322 has the disadvantage that the image detector is structurally complicated and the fabrication cost becomes high, because TFTs for reading electric charge are provided within the electrode layer equipped with micro plates.

In addition, the method as described in the abovementioned U.S. Pat. No. 4,857,723 is a method in which the solid state radiation is structurally simple and the fabrication cost is low, but requires a structurally complicated expensive layer scanning system for reading out the latent image charge stored within the detector. Because of this, the method has the disadvantage that the reader is structurally complicated and the cost of the entire system from recording to reading becomes high.

Furthermore, the method as described in the abovementioned Japanese Unexamined Patent Publication No. 9(1997)-5906, in addition to the disadvantage found in the method described in the above-mentioned U.S. Pat. No. 4,857,723, requires a light source for causing primary charging in the charge storage portion of the detector, so it has the disadvantage that the detector is further increased in scale and the system costs become even higher.

SUMMARY OF THE INVENTION

It is the primary object of the present invention to provide an image detector, a recording method and a recorder for recording radiation image information in the image detector, and a reading method and a reader for reading out radiation image information from the image detector recorded with the radiation image information, which are capable of making its structure simple without using a thin film transistor, also reducing the fabrication cost, and making a simple read operation possible without using a light source for primary charging, or reading.

In accordance with the present invention, there is provided an image detector, which has a charge storage portion for storing an electric charge with a quantity corresponding to the quantity of a recording electromagnetic wave irradiated, for recording image information on the charge storage portion as an electrostatic latent image, the image detector comprising:

a first electrode layer with a first stripe electrode including a large number of line electrodes;

a photoconductive layer which exhibits photoconductivity when irradiated with the recording electromagnetic wave, and/or with light, emitted by excitation of the electromagnetic wave, which has a wavelength differing from the wavelength of the electromagnetic wave;

a rectifying layer; and a second electrode layer with a second stripe electrode including a large number of line electrodes formed so as to cross the line electrodes of the first stripe electrode;

wherein the first electrode, the photoconductive layer, the charge storage portion, the rectifying layer, and the second electrode layer are stacked in the recited order.

The aforementioned recording electromagnetic wave refers to an electromagnetic wave incident on the detector. The electromagnetic wave will be sufficient if it carries image information. For instance, radiation such as X-rays, etc., or light (not limited to visible light) can be employed. It may also be light, emitted by excitation of a primary electromagnetic wave (radiation, light) emitted from an electromagnetic wave source, which has a wavelength differing from the wavelength of the primary electromagnetic wave.

The aforementioned line electrode refers to a long and narrow electrode. It may have any shape such as a column shape, a square pillar shape, etc., as long as it is long and narrow. Particularly, a flat electrode is preferred. When the line electrodes of the first stripe electrode are disposed so as to cross the line electrode of the second stripe electrode, it is preferable to dispose the line electrodes so that they cross approximately perpendicularly.

The aforementioned rectifying layer means a layer which allows a current to flow in one direction and prevents most of the current from flowing in the other direction.

The rectifying layer is generally constructed of an n-type semiconductor, an insulator, and a p-type semiconductor. However, depending on materials (e.g., α-Si, etc.) constituting these semiconductors, resistivity is small and there is a possibility that charge-transfer will occur within the p-type or n-type semiconductor and constitute a hindrance to image formation. Therefore, in the case where the charge-transfer cannot be allowed, the rectifying layer constituting the detector of the present invention is formed by disposing an n-type semiconductor, an insulator, and a p-type semiconductor in the recited order. One of the n-type and p-type semiconductors, which is disposed on the side of the charge storage portion, is divided two-dimensionally so as to correspond to pixel positions defined by the first and second stripe electrodes. Also, one of the n-type and p-type semiconductors, which is disposed on the side of the second electrode layer, is divided in stripe form (one-dimensionally) so as to correspond to the second stripe electrode, or divided two-dimensionally so as to correspond to the pixel positions. That is, it is preferable that the semiconductors be divided in both directions where both stripe electrodes are arrayed.

The expression "pixel positions defined by the first and second stripe electrodes" means spatial positions between both stripe electrodes, defined when both stripe electrodes cross three-dimensionally. The spatial positions do not always accurately coincide with the above-mentioned crossing positions, but in some cases move slightly, depending on a method of forming the charge storage portion. For example, when the charge storage portion is formed by conductive members to be described later, the pixel positions are subjected to the influence of the positions where the conductive members are disposed.

To divide the p-type and n-type semiconductors in the aforementioned manner, etching may be utilized. The image detector in this form will hereinafter be referred to as an image detector in which the rectifying layer is divided according to pixel positions.

Note that the insulator interposed between the n-type semiconductor and the p-type semiconductor may also be divided in stripe form (one-dimensionally) so as to correspond to the first or second stripe electrode, or divided two-dimensionally so as to correspond to the aforementioned pixel positions.

In the image detector of the present invention, it will be sufficient if the charge storage portion for storing latent image charge is formed inside the photoconductive layer or near the inside of the layer. Preferably, the charge storage portion is formed by conductive members (micro plates) which are provided separately in an electrically non-connected (floating) state for each of the pixel positions and cause the aforementioned electric charge to be in the same electric potential state.

In the image detector of the present invention, it is preferable to provide a scintillator on the outside of the first electrode layer. The scintillator emits light having a wavelength differing from the wavelength of the recording electromagnetic wave, by excitation of the electromagnetic wave.

It is desirable that the rectifying layer of the image detector of the present invention have permeability with respect to the recording electromagnetic wave, or with respect to light, emitted by excitation of the recording electromagnetic wave, which has a wavelength differing from the wavelength of the electromagnetic wave.

To make the rectifying layer have permeability, it is formed from a material that has permeability with respect to the recording electromagnetic wave, or with respect to light, emitted by excitation of the recording electromagnetic wave, which has a wavelength differing from the wavelength of the electromagnetic wave.

The rectifying layer may include a large number of rectifying devices formed so that the size of each device is two-thirds or less of the smallest resolvable pixel size. Also, spaces between the rectifying devices may be filled with a material that has permeability with respect to the recording electromagnetic wave, or with respect to light, emitted by excitation of the recording electromagnetic wave, which has a wavelength differing from the wavelength of the electromagnetic wave.

In the case where the insulator interposed between the n-type semiconductor and the p-type semiconductor is divided in stripe form (one-dimensionally) so as to correspond to the first or second stripe electrode, or divided two-dimensionally so as to correspond to the aforementioned pixel positions, as described above, the entire rectifying layer is divided so as to correspond to the stripe electrode or the aforementioned pixel positions, and light is transmitted through between the divided members. In the case of the detector in this form, the rectifying layer practically has permeability with respect to the recording electromagnetic wave, or with respect to light, emitted by excitation of the recording electromagnetic wave, which has a wavelength differing from the wavelength of the electromagnetic wave.

In the image detector of the present invention, it is more desirable to provide a scintillator on the outside of the second electrode layer. The scintillator emits light having a wavelength differing from the wavelength of the recording electromagnetic wave, by excitation of the electromagnetic wave.

In accordance with the present invention, there is provided a method of fabricating the image detector in which the rectifying layer is divided according to pixel positions, the method comprising the steps of:

forming a second electrode layer;

forming one of n-type and p-type semiconductors on the second electrode layer and then etching the one semiconductor so that it is disposed facing a second stripe electrode;

forming an insulator on the etched one semiconductor;

forming the other of the n-type and p-type semiconductors on the insulator, and then etching the other semiconductor so that it faces the second stripe electrode and has desired pixel pitches and pixel widths in the longitudinal direction of the second stripe electrode;

forming a charge storage portion and a photoconductive layer on the etched other semiconductor in the recited order; and forming an electrode member, which forms a first electrode layer, on the photoconductive layer and then etching the electrode member in stripe form so that the first stripe electrode is disposed facing a position where the etched other semiconductor is disposed. Note that the second electrode layer may be formed on a photoconductive support member such as a glass substrate, etc.

In the fabrication method of the present invention, the aforementioned one semiconductor of the n-type and p-type semiconductors may be etched so as to have desired pixel pitches and widths in the longitudinal direction of the second stripe electrode. That is, it is divided in both the array direction of the second stripe electrode and the array direction of the first stripe electrode (longitudinal direction of the second strip electrode).

In accordance with the present invention, there is provided an image recording method of recording image information on a charge storage portion as an electrostatic latent image by irradiating a recording electromagnetic wave to the aforementioned image detector to store an electric charge with a quantity corresponding to the quantity of the electromagnetic wave in the charge storage portion, the image recording method comprising the steps of:

storing approximately uniform electric charge in the charge storage portion by applying a predetermined voltage between a first stripe electrode and a second stripe electrode; and performing the recording, by stopping the application of the predetermined voltage and irradiating the recording electromagnetic wave to the image detector.

The expression "by irradiating a recording electromagnetic wave" is not limited, for example, to irradiating a recording electromagnetic wave such as radiation etc., transmitted through a subject, directly to the detector, but includes indirect irradiation in which light emitted by excitation of a recording electromagnetic wave, such as fluorescent light emitted within a scintillator, is irradiated to the detector.

Also, in the image recording method in the case of using the detector in which no scintillator is stacked, a scintillator, which emits light with a wavelength differing from the wavelength of the recording electromagnetic wave by excitation of the electromagnetic wave, may be disposed so that it faces the first electrode layer and/or second electrode layer, and light emitted from the scintillator may be irradiated to the detector. This is practically equivalent to using the detector in which a scintillator is stacked.

In this case, it is preferable to dispose a scintillator, which emits light with a wavelength differing from the wavelength of the recording electromagnetic wave by excitation of the electromagnetic wave, so that it faces one of the first and second electrode layers, and it is also preferable to irradiate the recording electromagnetic wave to the other electrode layer in which the scintillator is not disposed. This is because radiation can be utilized without waste and the charge generation efficiency can be enhanced.

Similarly, in the recording method in the case of using the detector in which the scintillator is disposed only on the outside of one of the first and second electrode layers, irradiating the recording electromagnetic wave to the electrode layer in which the scintillator is not disposed is preferred, because radiation can be utilized without waste and the charge generation efficiency can be enhanced.

In accordance with the present invention, there is provided an image reading method of reading out image information from the above-mentioned image detector in which the image information is recorded as an electrostatic latent image, the image reading method comprising the steps of:

applying a predetermined voltage between each line electrode, which constitutes a first stripe electrode, and all line electrodes, which constitute a second stripe electrode;

detecting a charging current which flows in the image detector by the application of the predetermined voltage; and obtaining an electrical signal with a level corresponding to the quantity of an electric charge stored in a charge storage portion, by the detection of the charging current.

In accordance with the present invention, there is also provided a unit for realizing the above-mentioned image recording method, i.e., an image recorder for recording image information on a charge storage portion as an electrostatic latent image by irradiating a recording electromagnetic wave to the above-mentioned image detector to store an electric charge with a quantity corresponding to the dose of the electromagnetic wave in the charge storage portion, the image recorder comprising:

recording-voltage applying means for storing approximately uniform electric charge in the charge storage portion by applying a predetermined voltage between a first stripe electrode and a second stripe electrode; and control means for controlling the recording-voltage applying means and the irradiation of the electromagnetic wave so that after the application of the predetermined voltage is stopped, the recording electromagnetic wave is irradiated to the image detector.

Furthermore, in accordance with the present invention, there is provided a unit for realizing the above-mentioned image reading method, i.e., an image reader for reading out image information from the above-mentioned image detector in which the image information is recorded as an electrostatic latent image, the image reader comprising:

reading-voltage applying means for applying a predetermined voltage between each line electrode, which constitutes a first stripe electrode, and all line electrodes, which constitute a second stripe electrode; and image signal acquisition means for acquiring an electrical signal with a level corresponding to the quantity of an electric charge stored in a charge storage portion, by detecting a charging current which flows in the image detector by the application of the predetermined voltage.

When applying a predetermined voltage between each line electrode of the first stripe electrode and all the line electrodes of the second stripe electrode, it is preferred to apply the voltage in sequence in the longitudinal direction of the line element of the first stripe electrode, from one end toward the other end.

According to the image recording method and image recorder of the present invention, an electrical signal with a level corresponding to the quantity of the latent image stored in the charge storage portion is obtained, by using an image detector in which the line electrodes of the first stripe electrode are disposed so as to cross the line electrodes of the second stripe electrode, also by applying a predetermined voltage between each line electrode of the first stripe electrode and all the line electrodes of the second stripe electrode, and by detecting a charging current that flows in the detector by the application of the voltage. Therefore, a simple switch, such as a metal-oxide-semiconductor field-effect transistor (MOSFET), etc., can be used as a means for connecting each line electrode of the first stripe electrode with all the line electrodes of the second stripe electrode, and the image reader of the present invention can be constructed simply and cheaply.

Also, according to the image recording method and image recorder of the present invention, voltage is applied across the detector to store uniform electric charge in the charge storage portion, and then recording light is irradiated to store the latent image charge carrying image information in the charge storage portion. Therefore, since no light source is required as a means for storing uniform electric charge in the charge storage portion, the image recorder of the present invention can also be constructed simply and cheaply.

In addition, since the image detector used in the image recording method, the image recorder, the image reading method, and the image reader uses no thin film transistor and has a simple structure in which layers are stacked, the fabrication cost can be reduced.

Furthermore, since a scintillator can be stacked on the detector, it becomes possible to use a desired detector according to photographing conditions, such as the surface of the detector through which recording light is irradiated, the magnitude of an irradiation dose, etc. Therefore, the detectors of the present invention are convenient to use.

For example, if the rectifying layer or charge storage portion is caused to have transparency with respect to a recording electromagnetic wave or fluorescent light, radiation or fluorescent light irradiated through the upper and lower surface of the detector can be detected and therefore sensitivity can be enhanced. In addition, if a scintillator is stacked on the detector, recording radiation can be converted to fluorescent light, and this fluorescent light can be irradiated to the photoconductive layer. Therefore, the charge generation efficiency is enhanced. As a result, the signal-to-noise (S/N) ratio of an image can be enhanced and the radiation dose can be reduced to decrease a radiation dose that to which a subject is exposed.

If the charge storage portion of the detector is formed by a large number of conductive members provided separately for each pixel, sharpness during recording can be enhanced.

Also, if a charge storage portion is formed by conductive members (micro plates), which are provided separately in an electrically non-connected state for each pixel position and cause latent image charge to be in the same electric potential state, it becomes possible to cause the latent image charge for each pixel stored on the conductive members to be in the same electric potential state. Compared with the case where there is no conductive member, the charge storage portion can be satisfactorily formed and the reading efficiency can be improved. The reason for this is that since the potential of the latent image charge is held constant within the conductive member, the latent image charge which is generally difficult to read out can transfer to the central portion of the conductive member (i.e., the pixel central portion) in accordance with the process of read operation, as long as it is within the conductive layer, and therefore the latent image charge can be discharged more sufficiently.

Furthermore, if the n-type semiconductor and the p-type semiconductor (preferably, including the insulator), which form the rectifying layer, are divided as described above by etching, charge-transfer within the semiconductor can be restricted to the divided range. As a result, an image detector, which is capable of reading out latent image charge while reliably storing it at pixel positions and also capable of satisfactorily reproducing an image, can be fabricated comparatively simply.

BRIEF DESCRIPTION OF THE DRAWINGS

The above and other objects and advantages will become apparent from the following detailed description when read in conjunction with the accompanying drawings wherein:

FIG. 4 is a circuit diagram of the recording-reading unit in which the solid state radiation detector is shown with an equivalent circuit;

FIG. 17 is a timing diagram when fluoroscopic photographing, as real-time detection, and still-picture photographing are switched.

DESCRIPTION OF THE PREFERRED EMBODIMENTS

Figure 1A:
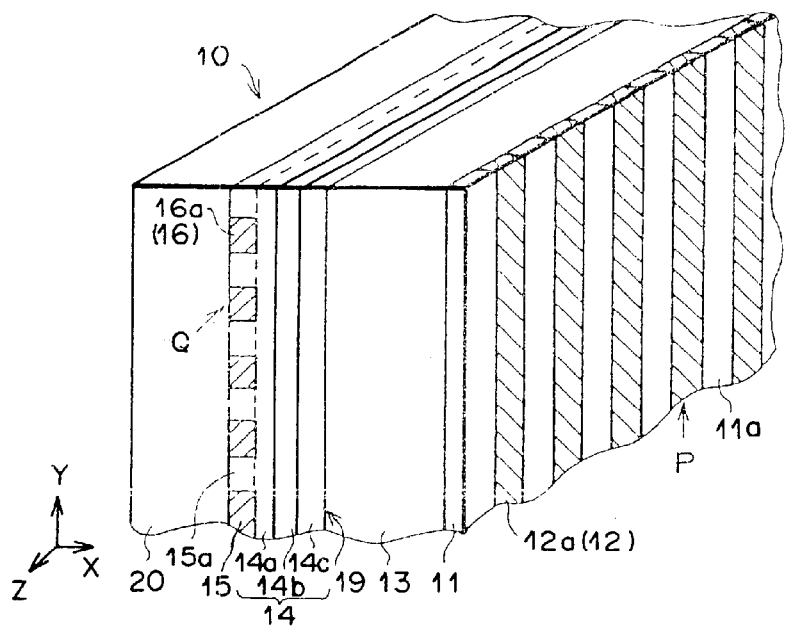
FIG. 1A is a perspective view showing a first embodiment of a solid state radiation detector which is one embodiment of an image detector of the present invention.
Figure 1B:
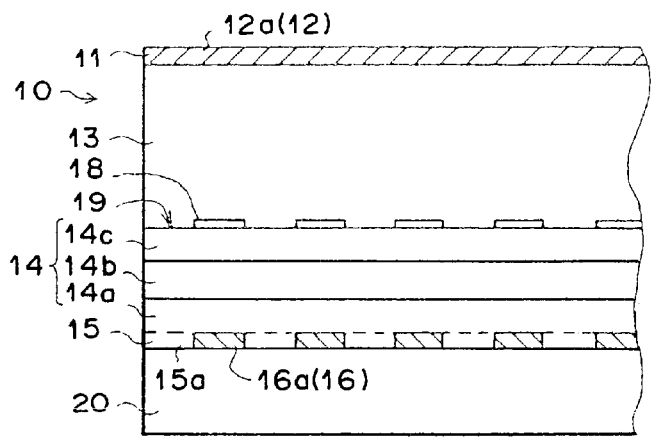
FIG. 1B is an XZ-section of the solid state radiation detector taken in a direction of arrow Q shown in FIG. 1A.
Figure 1C:
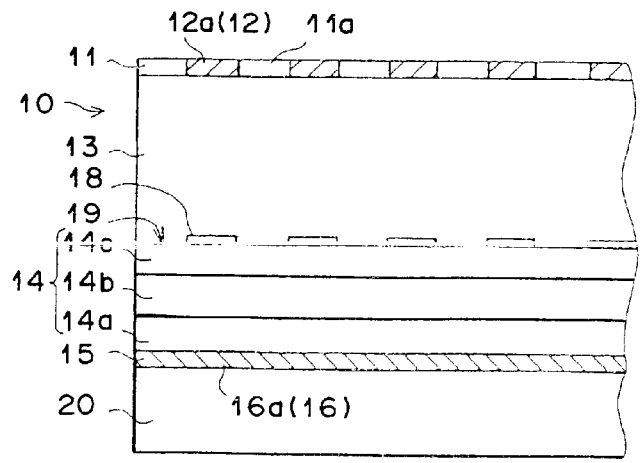
FIG. 1C is an XY-section of the solid state radiation detector taken in a direction of arrow P shown in FIG. 1A.
Figure 2A:
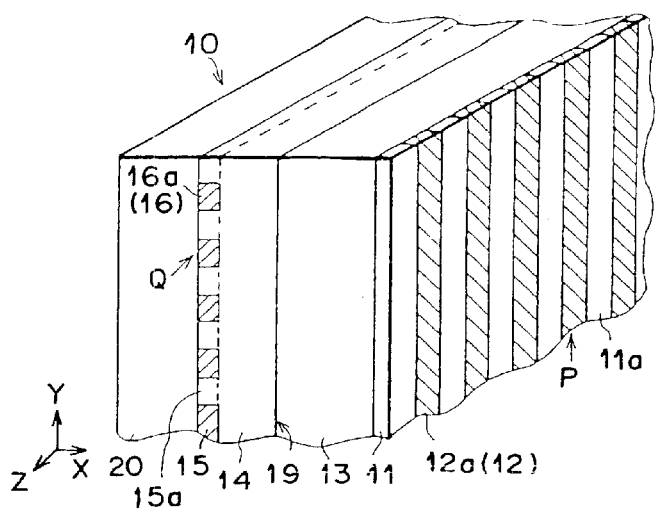
FIG. 2A is a perspective view showing a detector in which a rectifying layer is divided according to pixel positions.
Figure 2B:
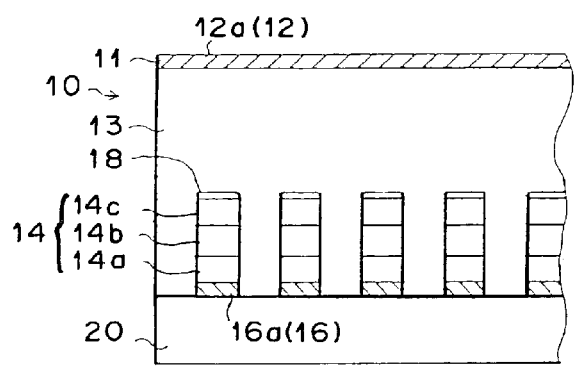
FIG. 2B is an XZ-section of the detector of FIG. 2A taken in a direction of arrow Q shown in FIG. 2A.
Figure 2C:
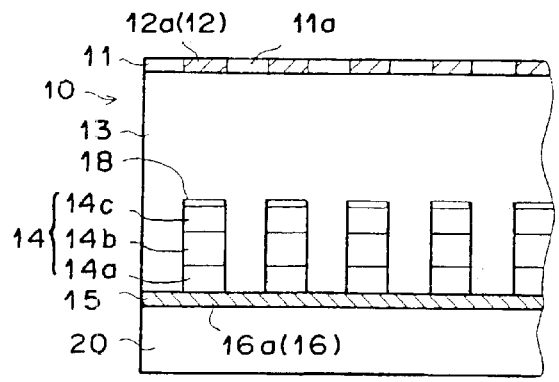
FIG. 2C is an XY-section of the detector of FIG. 2A taken in a direction of arrow P shown in FIG. 2A.
Figure 2D:
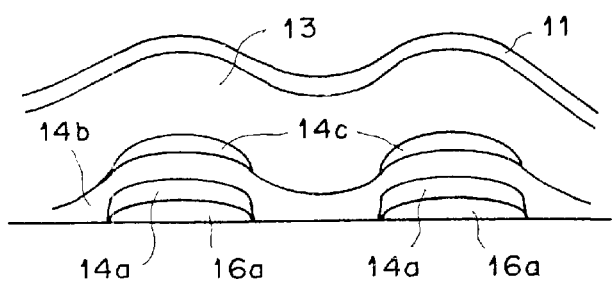
FIG. 2D is an enlarged view showing the rectifying devices of FIG. 2B.

Referring now in greater detail to the drawings and initially to FIG. 1, there is shown a first embodiment of an image detector (also stated as simply a detector) of the present invention.

The detector 10 is constructed of a first electrode layer 11, a photoconductive layer 13, a rectifying layer 14, and a second electrode layer 15, which are stacked in the recited order. A first stripe electrode 12 is formed in the first electrode layer 11 and consists of a plurality of flat elements (line electrodes) 12a arrayed in stripe form. The photoconductive layer 13 exhibits photoconductivity when irradiated with light for recording (hereinafter referred to as recording light) L2 that carries the image information of a subject. A second stripe electrode 16 is formed in the second electrode layer 15 and consists of a plurality of flat elements (line electrodes) 16a arrayed in stripe form. The above-mentioned layers are disposed on a glass substrate 20 so that the second electrode layer 15 contacts the upper surface 20a of the substrate 20. Furthermore, a charge storage portion 19 for storing latent image charge (which is a latent image in the form of electric charge) is formed between the photoconductive layer 13 and the rectifying layer 14.

The elements 12a of the first stripe electrode 12 and the elements 16a of the second stripe electrode 16 are disposed so that they cross approximately perpendicularly. The stripe electrodes 12, 16 are both provided with the same number of elements as the number of pixels in the direction of disposition. The element pitch (or distance between the centers of two adjacent elements) prescribes the pixel pitch. Making the width of each element of the first stripe electrode 12 wider is preferred because the signal-to-noise (S/N) ratio becomes greater. For example, the pitch is made 100 μm and the width is made 90 μm. The gaps 11a between the elements 12a and the gaps 15a between the elements 16a are filled with an insulating material that has permeability with respect to the recording light L2. The stripe electrodes 12, 16 will be sufficient if they are conductive, and the elements 12a, 16a can be formed from single metal, such as gold, silver, aluminum, platinum, etc., or from an alloy such as indium oxide, etc.

The appropriate substance of the photoconductive layer 13 is a photoconductive substance that has α-Si (amorphous silicon) as its main ingredient. It is preferable that the thickness of the photoconductive layer 13 is such that the recording light L12 can be sufficiently absorbed. If it is too thick compared with the thickness of the rectifying layer 14, however, signal current to be fetched from the detector will become smaller. Therefore, the thickness of the photoconductive layer 13 is set according to the thickness of the rectifying layer 14.

At pixel positions on the interface (i.e., the charge storage portion 19) between the photoconductive layer 13 and the rectifying layer 14, which correspond to the positions where the elements 12a and the elements 16a cross, micro plates (conductive members) 18 are disposed in a separate state with spaces between adjacent micro plates 18, i.e., in a floating state where the micro plates 18 are not connected anywhere.

Preferably, the micro plates 18 have a dimension that occupies a range of nearly the same size as the pixel size. Note that the dimension does not always occupy the range of nearly the same size as the pixel size, but may be greater or smaller than the pixel size. In addition, the smallest resolvable pixel size corresponds to either the dimension of the micro plate 18 or the crossed area of both elements 12a, 16a, which ever is the greatest between the two.

The macro plates 18 are deposited between the photoconductive layer 13 and the rectifying layer 14, for example, by vacuum deposition or chemical deposition, and can be formed from an extremely thin film (e.g., about 100 Å), with a single metal, such as gold, silver, aluminum, copper, chrome, titan, platinum, etc., or with an alloy such as indium oxide, etc.

In the rectifying layer 14, a p-type semiconductor and an n-type semiconductor are arranged in the recited order from the side of the glass substrate 20. In this embodiment, the p-type semiconductor and the n-type semiconductor employ a material that has α-Si as its main ingredient. In this case, there is a need to interpose an insulator between the p-type semiconductor and the n-type semiconductor in order to obtain better rectifying performance. Hence, the rectifying layer 14 in this embodiment consists of a p-type α-Si layer 14a as a p-type semiconductor, an intrinsic α-Si layer 14b as an insulator, and an n-type α-Si layer 14c as an n-type semiconductor, which are arranged in the recited order. With this arrangement, a diode (rectifying device) 14d is constructed with the p-type α-Si layer 14a as its anode and the n-type α-Si layer 14c as its cathode. The detector 10 is generally formed by stacking layers in sequence from the side of the glass substrate 20. In this case, the p-type α-Si layer 14a is stacked after the elements 16a are deposited on the glass substrate 20, and consequently, the gaps 15a between the elements 16a within the second electrode layer 15 are also filled with the p-type α-Si.

Note that since the thickness of each layer, pixel pitch, pixel width, etc., are schematically illustrated, they have not been reflected correctly in dimensions. For example, although it is shown that the thickness of the rectifying layer 14 is greater than that of the element 12a, the thickness of the rectifying layer 14 is set sufficiently smaller than the pixel pitch (about 100 μm for this embodiment). The thickness of the rectifying layer 14 is normally set to about 0.5 μm.

The p-type α-Si layer 14a as the anode of the diode 14d is also stacked on the elements 12 of the first stripe electrode 12, so each element 12a functions as the anode terminal. On the other hand, the micro plates 18 are stacked on the n-type α-Si layer 14c serving as the cathode and therefore each micro plate 18 functions as the cathode terminal. That is, separate diodes 14d are practically connected between the elements 12a and the micro plates 18.

Note that if material having α-Si as its main ingredient is employed as a p-type semiconductor, an insulator, and an n-type semiconductor, as in this embodiment, the resistivities of the p-type and n-type semiconductors will be reduced and therefore there will be a possibility that charge-transfer will occur within the p-type or n-type semiconductor and constitute a hindrance to image formation. Hence, in the image detector 10 of this embodiment, to prevent the charge-transfer, the n-type α-Si layer 14c (as an n-type semiconductor) disposed on the side of the charge storage portion 19 (more specifically, the side contacting the micro plates 18) is divided so as to correspond to the pixel positions that are positions at which the elements 12a and the elements 16a cross. Also, the p-type α-Si layer 14a as a p-type semiconductor, disposed on the side of the elements 16a of the second stripe electrode 16, is divided in stripe form so as to correspond to the elements 16a.

Note that the p-type α-Si layer 14a may also be divided so as to have pixel pitches (i.e., distance between the centers of two adjacent elements 12a) and pixel widths in the longitudinal direction of the element 16. In this case, the p-type α-Si layer 14a is divided so as to correspond to positions facing the n-type α-Si layer 14c, that is, the pixel positions that are positions at which the elements 12a and the elements 16a cross.

In addition, the intrinsic α-Si layer 14b as an insulator, interposed between the p-type α-Si layer 14a and the n-type α-Si layer 14c, may also be divided in stripe form so as to correspond to either the elements 12a or the elements 16a, or be divided so as to correspond to the aforementioned pixel positions, that is, so as to have predetermined pixel pitches and pixel widths in each of the array directions of both elements 12a, 16a.

FIG. 2 illustrates a detector in which the p-type α-Si layer 14a, the intrinsic α-Si layer 14b, and the n-type α-Si layer 14c are all divided so as to correspond to the aforementioned pixel positions. FIG. 2D illustrates the rectifying device in the XY-section of a detector in which the p-type α-Si layer 14a and the n-type α-Si layer 14c are both divided so as to correspond to the aforementioned pixel positions.

In fabricating the detector 10 shown in FIG. 2, it is preferable to adopt the following method of fabrication.

A thin film of electrode material, which is to be formed as the second stripe electrode 16, is first formed on the glass substrate 20. Then, the formed electrode film is etched in stripe form so that the elements 16a have a desired pixel pitch and pixel width. Next, a thin film of p-type α-Si is formed on the elements 16a formed by etching. The formed p-type α-Si film is etched so as to face the elements 16a, i.e., so as to correspond to the pixel positions. With the etching, divided p-type α-Si layers 14a are formed. Next, a thin film of α-Si as an insulator is formed on the divided p-type α-Si layers 14a. The formed α-Si film is etched so as to face the elements 16a, and also so as to have desired pixel pitches and pixel widths in the longitudinal direction of the element 16a, that is, so as to correspond to the pixel positions. With the etching, divided intrinsic α-Si layers 14b are formed. Next, a thin film of n-type α-Si is formed on the divided intrinsic α-Si layers 14b. The formed n-type α-Si film is etched so as to face the elements 16a, and also so as to have desired pixel pitches and pixel widths in the longitudinal direction of the element 16a, i.e., so as to correspond to the pixel positions. With the etching, divided n-type α-Si layers 14c are formed. Next, a thin film of electrode material, which is to be formed as macro plates 18, is formed on the divided n-type α-Si layers 14c. The formed electrode film is etched to correspond to the divided n-type α-Si layers 14c. With the etching, the macro plates 18 are formed so as to correspond to pixels and are in a floating state.

In this manner, the p-type α-Si layer 14a, the intrinsic α-Si layer 14b, and the n-type α-Si layer 14c, which form the rectifying layer 14, are all divided to correspond to the pixel positions. As a result, there is no possibility that charge-transfer will occur between elements 16, or between macro plates 18.

Next, a thin film of α-Si (photoconductive material), which is to be formed as the photoconductive layer 13, is formed on the macro plates 18. Furthermore, a thin film of electrode material, which is to be formed as the first stripe electrode 12, is formed on the α-Si film. Finally, the film is etched in stripe form so that the elements 12 are disposed, facing the positions of the divided n-type α-Si layers 14c, i.e., so as to correspond to the divided n-type α-Si layers 14c.

Figure 3:
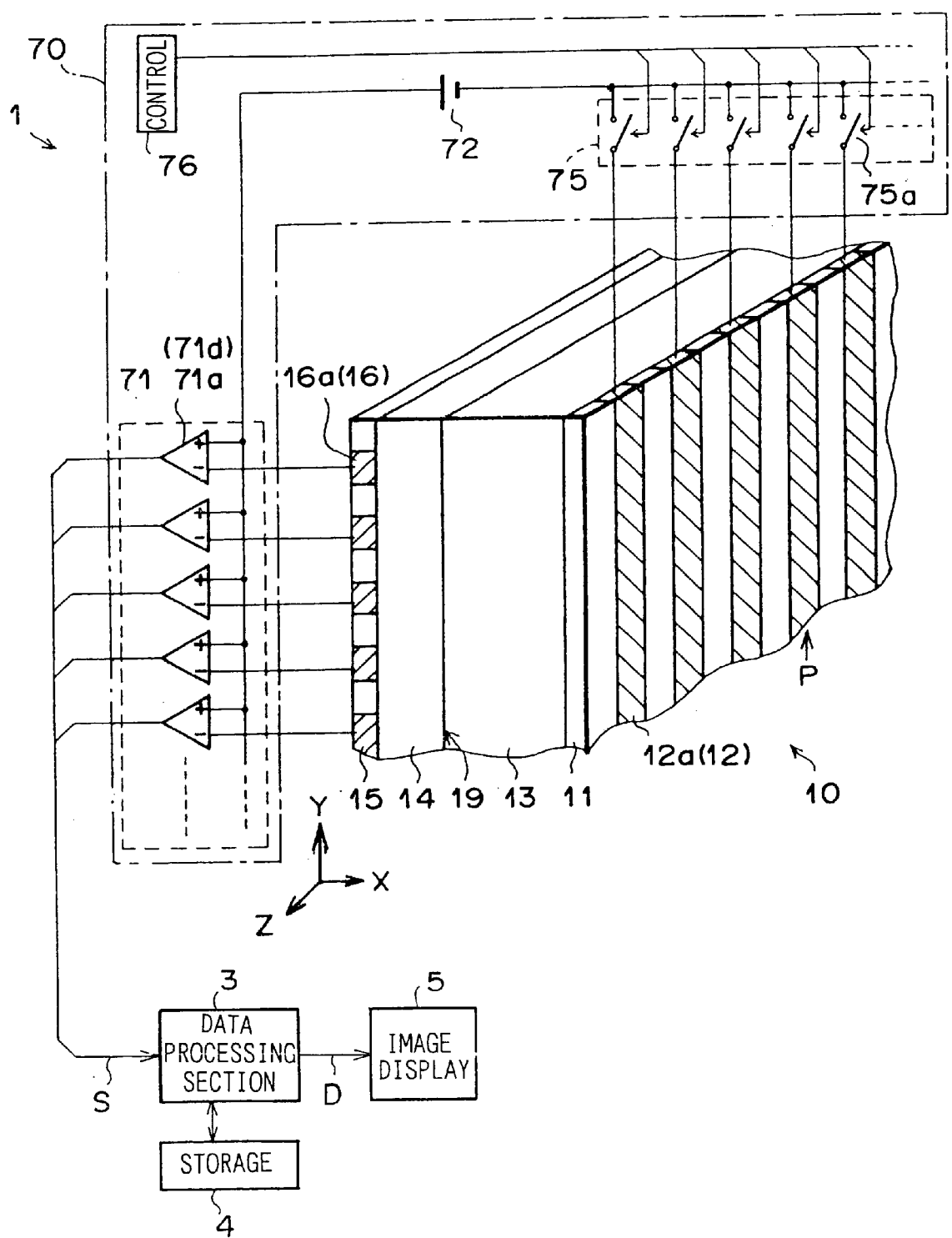
FIG. 3 is a perspective view showing a recording-reading unit that employs the solid state radiation detector.

FIGS. 3 and 4 illustrate a recording-reading unit 1, employing the above-mentioned detector 10, in which an image information recording (photographing) unit and an image information reading unit are united en bloc. FIG. 3 shows a perspective view of the detector 10, and FIG. 4 shows a circuit diagram of the recording-reading unit 1 in which the detector 10 is shown with an equivalent circuit. For clarity, the glass substrate 20 is omitted. In FIG. 4, a capacitor $C_a$ is formed between the micro plate 18 and the element 12a. Note that the recording-reading unit 1 can be utilized, for example, as a sensor for a film digitizer.

A current detection circuit 70 is provided with a current detection amplifier 71 as image signal acquiring means for detecting a charging current which flows in the detector 10, a power source 72, a switching section 75 having a plurality of switching elements 75a respectively connected with the elements 12a of the first stripe electrode 12, and control means 76. It is preferable that the switching element 75a have sufficiently great resistance when it is in an OFF-state. For instance, a metal-oxide-semiconductor field-effect transistor (MOSFET) is preferred.

The current detection amplifier 71 has a large number of operational amplifiers 71a, which constitute the essential part of the current detection amplifier 71. The non-inverting input terminals (+) of the operational amplifiers 71a are connected with the positive electrode of the power source 72, while the inverting input terminals (−) are connected to the elements 16a, respectively. The negative electrode of the power source 72 is connected in common to one of the two terminals of each switching element 75a.

The power source 72 and the switching section 75 as a whole constitute the recording-voltage applying means of the present invention, which applies a predetermined voltage between the first stripe electrode 12 and the second stripe electrode 16 to approximately uniformly store electric charge in the charge storage portion 19.

The switching section 75 is constructed such that it sequentially switches the elements 12a of the first stripe electrode 12 one by one in the longitudinal direction of the element 16a of the second stripe electrode 16 during reading and that the switched element 12a is connected with each element 16a of the second stripe electrode 16 through the power source 72 and the imaginary short of the operational amplifiers 71a. The sequential switching in the longitudinal direction of the element 16a by the switching section 75 corresponds to a vertical scan, and the charging current flowing in the detector 10 by the switching operation of the switching section 75 is detected at the same time (in parallel) for each element 12a of the first stripe electrode 12 by the operational amplifiers 71a. With this detection, an electrical signal with a level corresponding to the quantity of the electric charge stored in the charge storage portion 19 is acquired. Thus, the power source 72 and the switching section 75 as a whole constitute reading-voltage applying means for applying a predetermined voltage between each of the elements 12a of the first stripe electrode 12 and all the elements 16a of the second stripe electrode 16.

The output signal S of the current detection circuit 70 is input to a data processing section 3 and temporarily stored in a storage device 4. Then, predetermined image processing is performed on the signal S, and the processed data D is input to image display means 5, which in turn displays a visible image representative of image information.

A description will hereinafter be given for a method of, in the recording-reading unit 1 of the above-mentioned construction, uniformly storing electric charge in the charge storage portion 19 of the detector 10, then recording the image information as an electrostatic latent image, and furthermore, reading out the recorded electrostatic latent image.

Figure 5A:
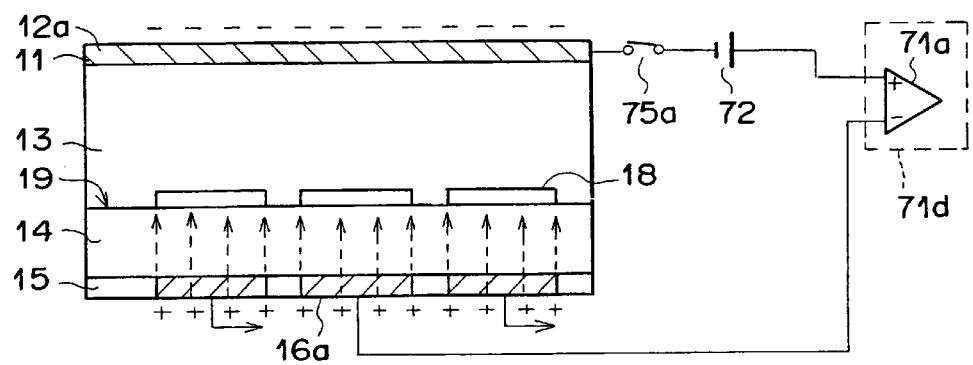
FIG. 5A is a circuit diagram showing a charge model for a uniform charge storing process in the case of using the solid state radiation detector of the first embodiment.
Figure 5B:
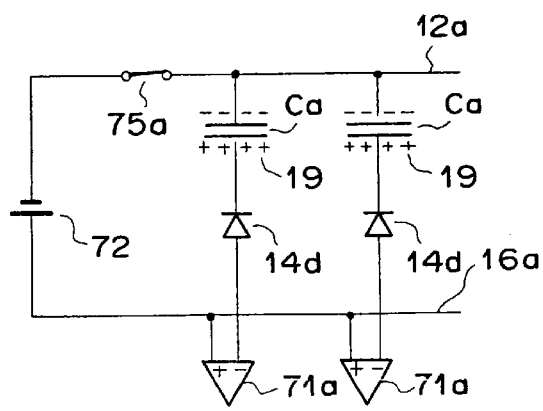
FIG. 5B is a circuit diagram showing the equivalent circuit of the charge model.

For the process of uniformly storing electric charge in the charge storage portion 19, a description thereof will be made with reference to a charge model shown in FIG. 5A. Shown in FIG. 5B is a circuit equivalent to the charge model. In both figures, the glass substrate 20 and the layer construction within the rectifying layer 14 are omitted for clarity.

In uniformly storing electric charge in the charge storage portion 19 of the detector 10, all the switching elements 75a of the switching section 75 are first switched on to apply dc current from the power source 72, through the operational amplifiers 71a, and between the first stripe electrode 12 and the second stripe electrode 16 so that the side of the second stripe electrode 16 becomes positive.

With the application of dc voltage, a predetermined electric field distribution is generated between the element 12a and the element 16a, and the electric field is applied across the capacitor $C_a$ formed between the element 12a and the micro plate 18, and across the diode 14d formed between the micro plate 18 and the element 16a. When this occurs, voltage is applied so that the side of the second stripe electrode 16 becomes positive and that the side of the elements 12a becomes positive. Therefore, the diode 14d is switched on and the positive charge on the elements 16a passes through the diode 14d and transfers to the micro plates 18. As a result, all the elements 12a of the first stripe electrode 12 are negatively charged and the micro plates 18 positively charged, and a voltage the same magnitude as the voltage applied by the power source 72 is generated between the micro plates 18 and the elements 12a (FIG. 5A).

Thus, in the case where the image detector according to the present invention is applied, a simple recorder can be constituted, because a light source is not required as primary charging means for uniformly storing electric charge in the charge storage portion 19.

Next, for the process of recording image information as an electrostatic latent image, a description thereof will be made with reference to a charge model shown in FIG. 6A. Note that the negative charge (−) and positive charge (+) generated within the photoconductive layer 13 by the recording light L2 are represented by − and +, enclosed by ○. Also, the glass substrate 20 and the layer construction within the rectifying layer 14 are omitted for clarity.

Figure 6A:
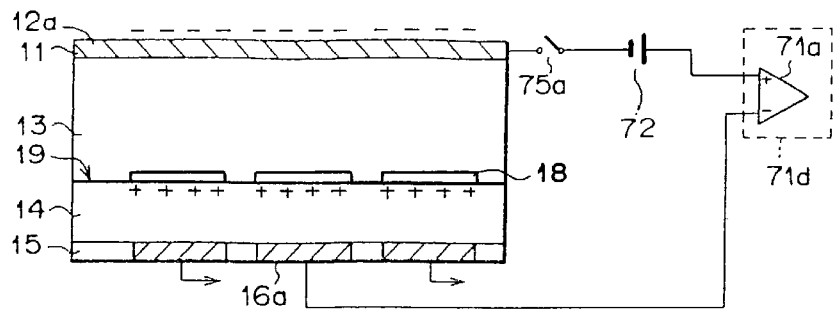
FIGS. 6A through 6C are circuit diagrams showing a charge model for an electrostatic latent image recording process in the case of using the solid state radiation detector of the first embodiment.

When recording an electrostatic latent image on the detector 10, all the switching elements 75a of the switching section 75 are first switched off to stop the application of voltage from the power source 72 to the detector 10 (FIG. 6A).

Then, visible light L1 is irradiated to a film 9 recorded with the image information of a subject, and the recording light L2 carrying the image information, transmitted through the transmitting portion 9a of the film 9, is irradiated to the side of the first electrode layer 11 of the detector 10. Note that in the case where the recording light L2 is irradiated through the first electrode layer 11, the first stripe electrode 12 has permeability with respect to the recording light L2.

Figure 6B:
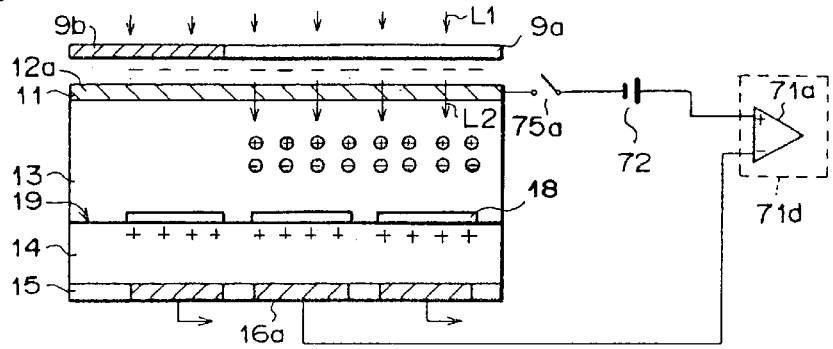
Figure 6C:
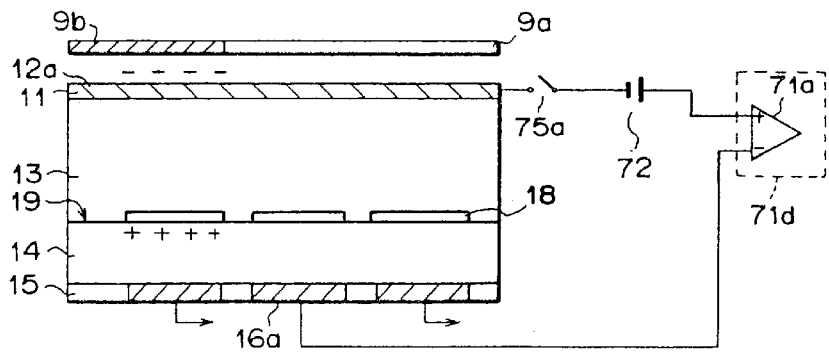
Figure 6D:
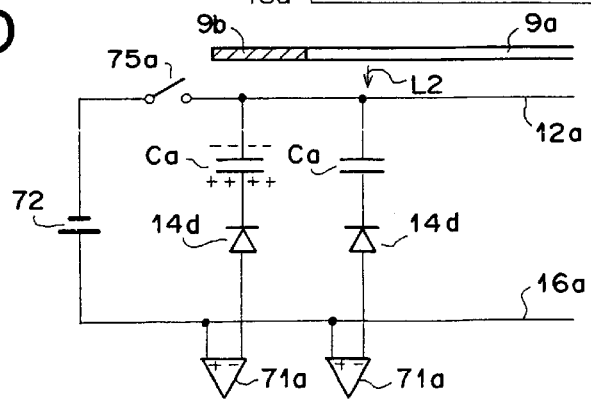
FIG. 6D is a circuit diagram showing the equivalent circuit of the charge model.

The recording light L2 is transmitted through the first electrode layer 11 of the detector 10 and causes a pair of positive and negative charges with a quantity corresponding to the dose of the recording light L2 to be generated within the photoconductive layer 13 (FIG. 6B). Between the first stripe electrode 12 and the charge storage portion 19, a predetermined electric field distribution has been generated between the negative charge on the elements 12a and the uniform positive charge captured on the micro plates 18. Therefore, in proportion to this electric field distribution, the positive charge of the generated charge pair transfers to the side of the first electrode layer 11 and disappears, recombining with the negative charge on the elements 12a of the first stripe electrode 12. Also, the negative charge transfers to the side of the charge storage portion 19 and disappears, recombining with the positive charge on the micro plates 18 (right side portion in FIG. 6C).

On the other hand, since there is no possibility that the visible light L1 irradiated to the non-transmitting portion 9b of the film 9 will be transmitted through the non-transmitting portion 9b, no charge pair is generated within the photoconductive layer 13 corresponding to that portion. Therefore, the element 12a of the first stripe electrode 12 remains negatively charged. Also, because no current flows from the cathode of the diode 14d to the anode, the micro plate 18 remains positively charged (left side portion in FIG. 6C).

In the above-mentioned description, incidentally, it has been described that a charge pair is generated within the photoconductive layer 13 by the quantity that the electric charge on the elements 12a and the electric charge on the micro plates 18 of the charge storage portion 19 all disappear. However, the quantity of the charge pair that is actually generated is proportional to the intensity or dose of the recording light L2 incident on the detector 10. Thus, the charge pair with a quantity that causes all the electric charges generated on the elements 12a and micro plates 18 of the detector 10 by the application of voltage to disappear is not always generated in the photoconductive layer 13.

That is, the quantity (B) of the electric charge generated within the detector 10 is approximately proportional to the intensity or dose of the recording light L2, transmitted through the transmitting portion 9a of the film 9 and incident on the detector 10. Therefore, the quantity (C) of the electric charge which remains stored in the detector 10 is the quantity (A) of the uniform charge stored in the charge storage portion 19 by application of voltage minus the quantity (B) of the generated charge (C=B−A). As a result, the quantity of the positive charge on the charge storage portion 19 varies according to the intensity or dose of the recording light L2, and an electrostatic latent image is recorded on the detector 10. Note that since the latent image charge is concentrated and stored on the micro plates 18, sharpness during recording can be enhanced.

Next, for the process of reading out the electrostatic latent image recorded on the detector 10, a description thereof will be made with reference to a charge model shown in FIG. 7. For clarity, the glass substrate 20 and the layer construction within the rectifying layer 14 are omitted.

Figure 7A:
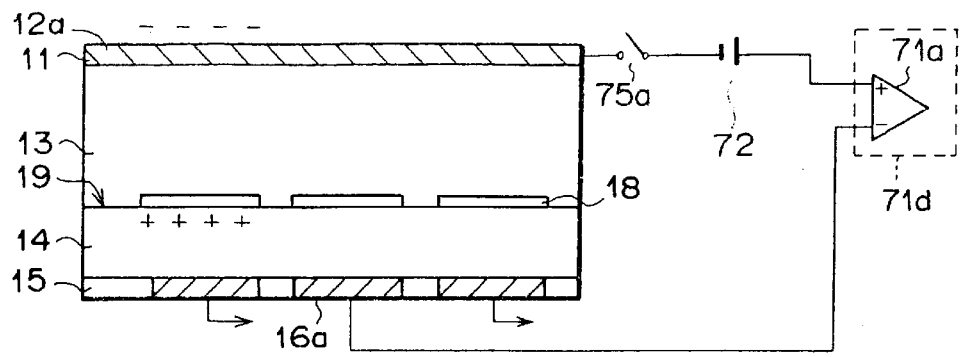
FIGS. 7A through 7C are circuit diagrams showing a charge model for an electrostatic latent image reading process used in the solid state radiation detector of the first embodiment when a charging current is detected.

When reading out the electrostatic latent image from the detector 10, it is constructed such that a voltage of the same polarity and magnitude as the voltage applied to the detector 10 prior to irradiation of the recording light L2, i.e., dc voltage from the power source 72 is applied between the element 12a and the element 16a through the imaginary short of the operational amplifier 71a when the switching element 75a of the switching section 75 is switched on (FIG. 7A).

Figure 7B:
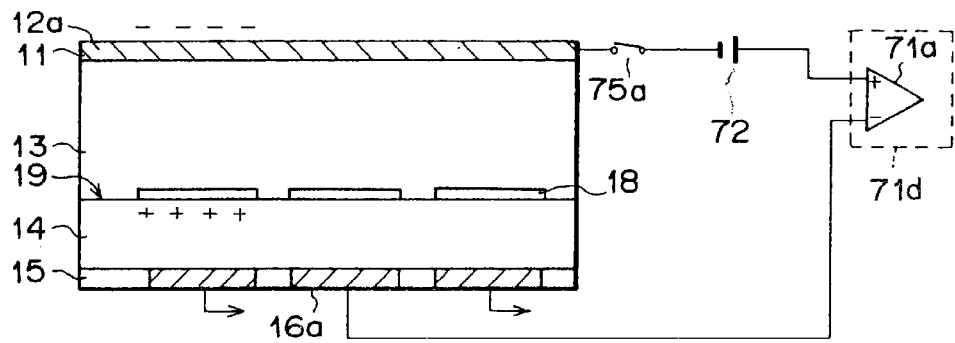

Next, the switching elements 75a of the switching section 75 are switched on one by one from one end of the switching section 75 toward the other end in the longitudinal direction of the element 16a. With the switching, voltage is applied from the power source 72 between the element 12a, connected with the switching element 75a switched on, and the elements 16a of the second stripe electrode 16 (FIG. 7B).

With the application of voltage to the detector 10 by the sequential switching, as with the uniform-charge storing process, the elements 12a, corresponding to micro plates 18 not positively charged, are negatively charged and the micro plates 18 are positively charged. On the other hand, in the micro plate 18 positively charged, a voltage of near the same magnitude as the applied voltage has been generated between the element 12a and the micro plate 18. Therefore, the diode 14d is not switched on and there is no charge-transfer.

Figure 7C:
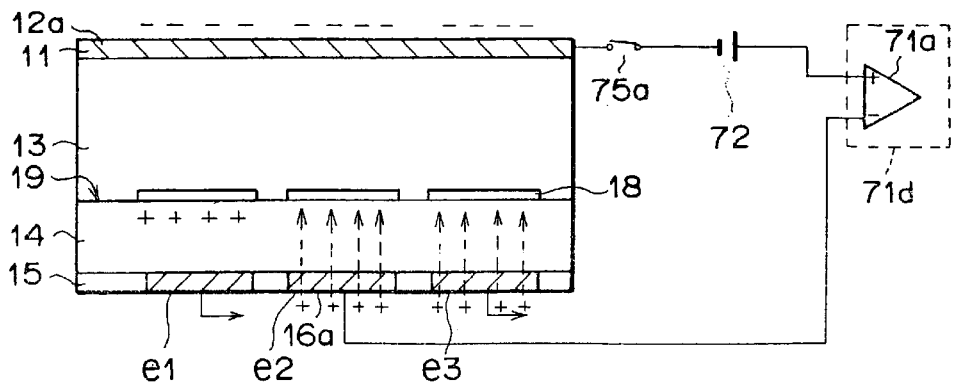
Figure 8A:
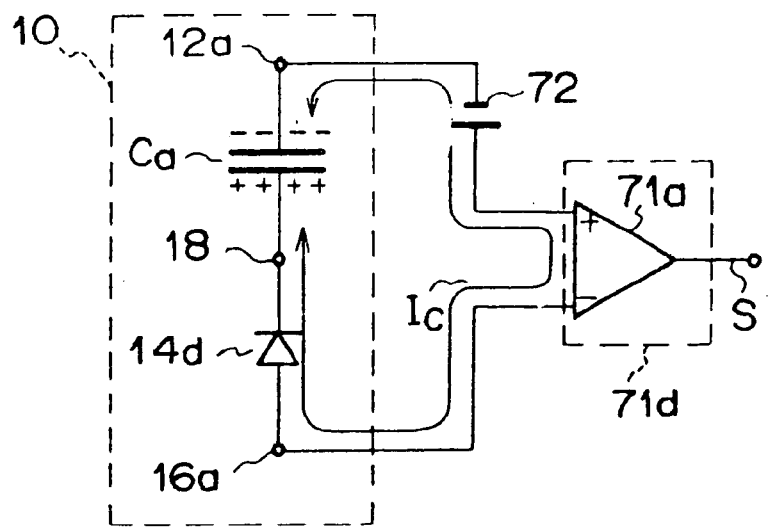
FIG. 8A is a circuit diagram showing how positive charge is redistributed when the charging current is detected.
Figure 8B:
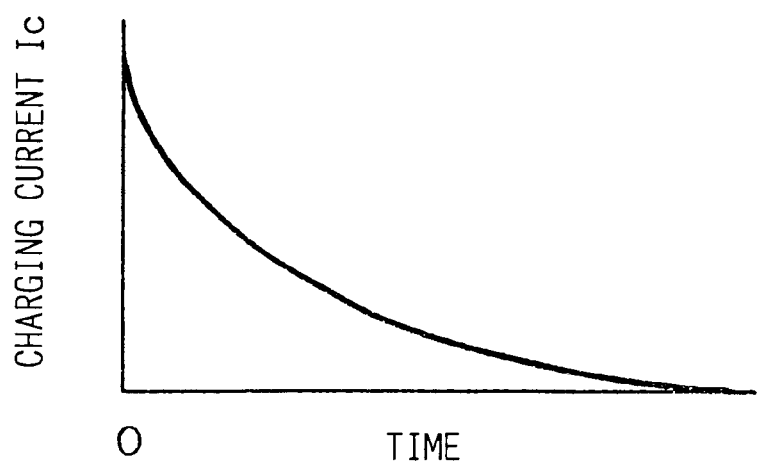
FIG. 8B is a diagram showing how the charging current changes.

For example, in FIG. 7C, there is no charge-transfer to the micro plate 18, corresponding to an element numbered e1, on which four positive charges are stored. On the other hand, four negative charges are stored on the element 12a that corresponds to the micro plate 18, corresponding to element e2 or e3, on which no positive charge is stored. Therefore, four positive charges are stored on the micro plate 18. In FIG. 8A, for the element e2, how to charge the micro plate 18 is represented by the equivalent circuit, and FIG. 8B shows a change in charging current $I_c$ when charging of the micro plate 18 is performed.

The current detection amplifiers 71d of the current detection amplifying section 71 detect the charging current which flows in the detector 10 by charge-transfer resulting from the above-mentioned charging, at the same time for each element 16a. The current detection amplifiers 71d also detect a change in the voltage observed sequentially on the output portions of the current detection amplifiers 71d in accordance with the latent image charge for each pixel, by the sequence switching made by the switching section 75. In this way an image signal representative of an electrostatic latent image is obtained. That is, image information is read out from the detector.

Thus, in the case where the image detector according to the present invention is applied, a simple reader can be constituted, because a light source is not required as a means for reading out latent image charge.

While it has been described that a voltage of the same polarity and magnitude as the voltage applied to the detector 10 immediately before irradiation of the recording light L2 is applied between the element 12a and the element 16a, the voltage to be applied between both elements is not always limited to this. For instance, in consideration of a reduction in the voltage across the detector 10 due to natural discharge, a voltage slightly lower than the voltage of the power source 72 may be applied. This is the most desirable applied voltage. Also, a voltage greater than the voltage of the power source 72 may be applied to give an offset quantity to a detected current.

Note that since the diode 14 has capacitance, redistribution of electric charge will take place so that the element 12a and the element 16a have the same electric potential. A signal current that can be fetched from the detector 10, i.e., a charging current that makes a contribution to an image signal is a recharging current to the photoconductive layer 13. Because of this, the charging current will change by the quantity of the electric charge distributed to the diode 14d. Therefore, in order to increase the charging current that makes a contribution to an image signal, it is preferable to reduce the ratio C1/C2 between the capacitance C1 of the diode 14d and the capacitance C2 of the photoconductive layer 13. For this reason, it is effective to make the element 16a thinner and reduce the area of the diode 14d, to lower the capacitance ratio. It is also effective to reduce the photoconductive layer to a thickness such that light can be sufficiently absorbed and make it as thin as possible.

Figure 9A:
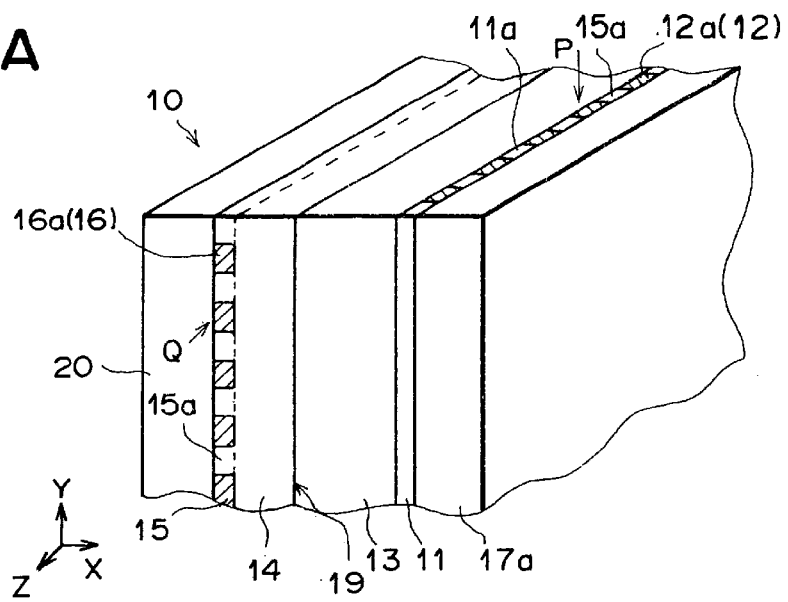
FIG. 9A is a perspective view showing a solid state radiation detector constructed according to a second embodiment of the present invention.
Figure 9B:
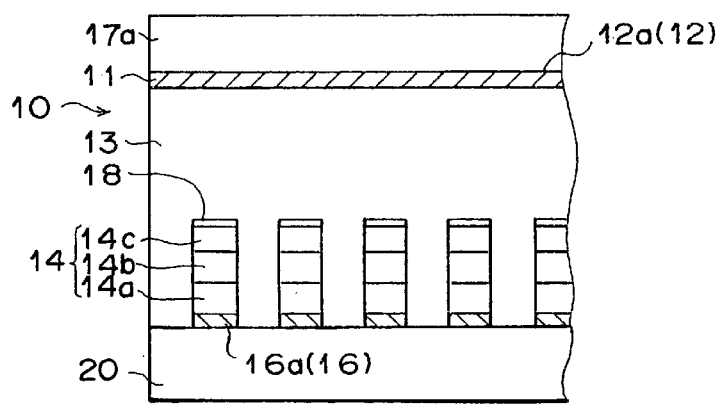
FIG. 9B is an XZ-section of the solid state radiation detector of FIG. 9A taken in a direction of arrow Q shown in FIG. 9A.
Figure 9C:
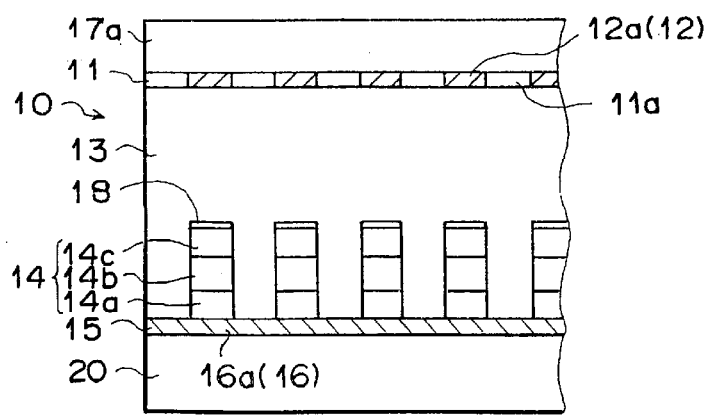
FIG. 9C is an XY-section of the solid state radiation detector of FIG. 9A taken in a direction of arrow P shown in FIG. 9A.

FIG. 9 illustrates a solid state radiation detector (also referred to simply as a detector), as an embodiment of the image detector, constructed according to a second embodiment of the present invention.

In the detector 10 of the second embodiment, as with the detector 10 of the aforementioned first embodiment, a rectifying layer 14 has α-Si as its main ingredient, and as shown in FIG. 9, a p-type α-Si layer 14a, an intrinsic α-Si layer 14b, and an n-type α-Si layer 14c, which form the rectifying layer 14, are all divided to correspond to pixel positions.

Figure 10:
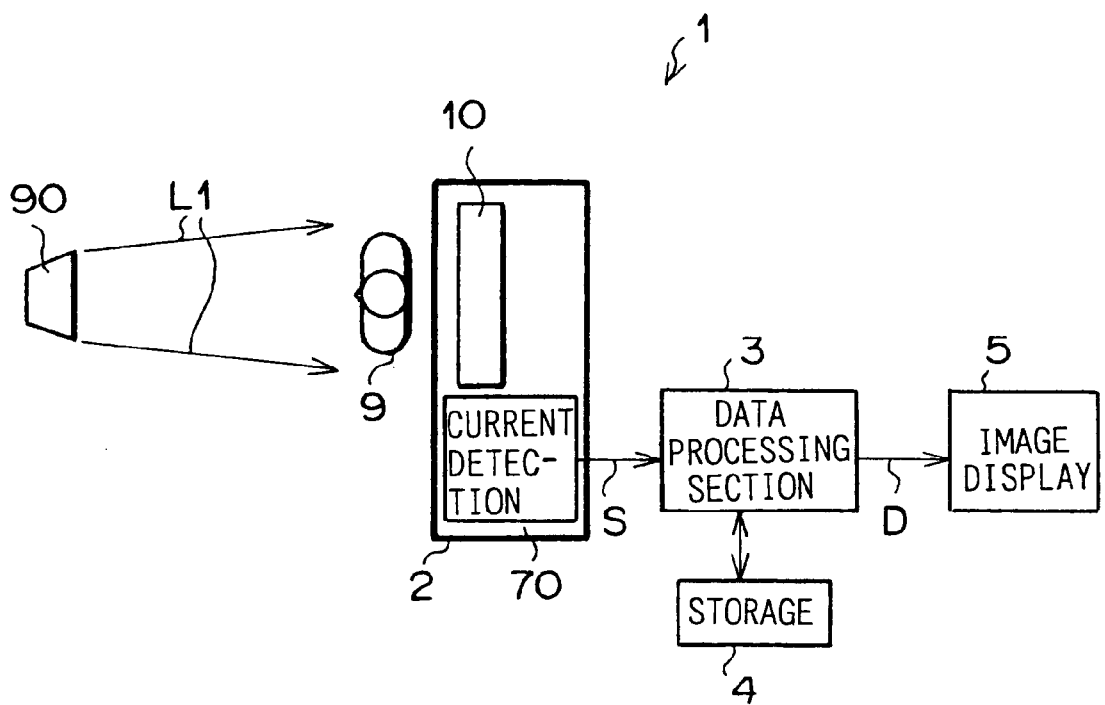
FIG. 10 is a block diagram showing a recording-reading unit.

FIG. 10 illustrates a recording-reading unit 1 employing the solid state radiation detector of the second embodiment. While the first embodiment is constructed such that the film 9 recorded with the image information of a subject is irradiated with the visible light L1, the second embodiment is constructed such that radiation L1 is emitted from a radiation source 90 to a subject 9 itself and that recording light L2 carrying the radiation image information of the subject 9, transmitted through the transmitting portion 9a of the subject 9, is irradiated to the detector 10. The detector 10 and a current detection circuit 70 are housed in a shielding case 2. The output signal S of the current detection circuit 70 is input to a data processing section 3 and temporarily stored in a storage device 4. Then, predetermined image processing is performed on the signal S, and the processed data D is input to image display means 5, which in turn displays a visible image representative of radiation image information.

In the detector 10 of the second embodiment, a scintillator 17a, which serves as a wavelength converting layer for emitting fluorescent light L4 with a different wavelength from the wavelength of the recording light L2 by excitation of the recording light L2, is stacked on the outside of the first electrode layer 11 of the detector 10 of the aforementioned first embodiment. In addition, a first electrode layer 11 has permeability with respect to the fluorescent light L4, and a photoconductive layer 13 exhibits photoconductivity when irradiated with the fluorescent light L4 emitted from the scintillator 17a.

It is preferable that the scintillator 17a have a high wavelength conversion efficiency with respect to the recording light L2. For example, in the case where the photoconductive layer 13 uses a photoconductive substance that has α-Si as its main ingredient, the layer 13 exhibits photoconductivity with greater efficiency with respect to green light. Therefore, it is preferred to employ a scintillator having GOS, CsI : Tl, etc., as its main ingredients so that green light is emitted from the scintillator 17a.

Also, in the case where the photoconductive layer 13 uses a photoconductive substance that has α-Se as its main ingredient, the layer 13 exhibits photoconductivity with greater efficiency with respect to blue light (wavelength of about 400 to 430 nm, the same applies to the following description). Therefore, it is preferable to employ a scintillator having $YTaO_4$: Nb, LaOBr : Tb, CsI :Tl, etc., as its main ingredients so that blue light is emitted from the scintillator 17a.

For the electrostatic latent image recording process in the case of using the detector 10 of the second embodiment, a description thereof will be given with reference to a charge model shown in FIGS. 11 and 12. As with the case of the detector 10 of the first embodiment, the negative charge (−) and positive charge (+), generated within the photoconductive layer 13 by the fluorescent light L4 emitted by excitation of the recording light L2. are represented by − and +, enclosed by ○. Since the uniform-charge storing process and the electrostatic latent image reading process are the same as the first embodiment, a description thereof will not be given. Also, the glass substrate 20 and the layer construction within the rectifying layer 14 are omitted for clarity.

For the electrostatic latent image recording process in the case of irradiating the recording light L2 through the side of the first electrode layer 11, i.e., the side of the scintillator 17a, a description thereof will be made with reference to FIG. 11.

Figure 11A:
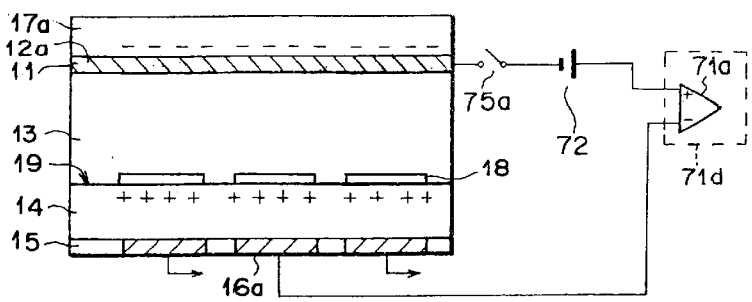
FIGS. 11A through 11D are circuit diagrams showing a charge model for an electrostatic latent image reading process used in the solid state radiation detector of the second embodiment when recording light is irradiated through the side of a scintillator.
Figure 11B:
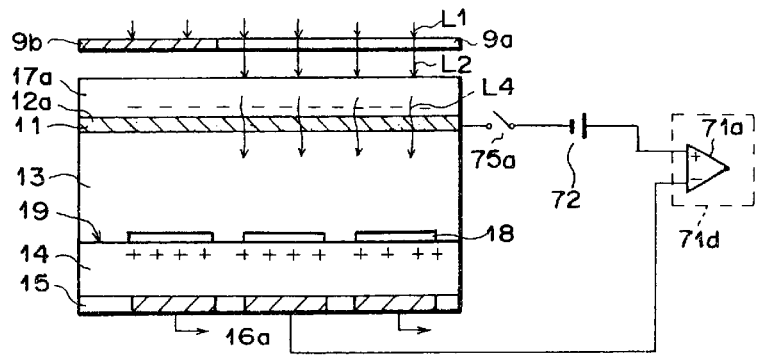
Figure 11C:
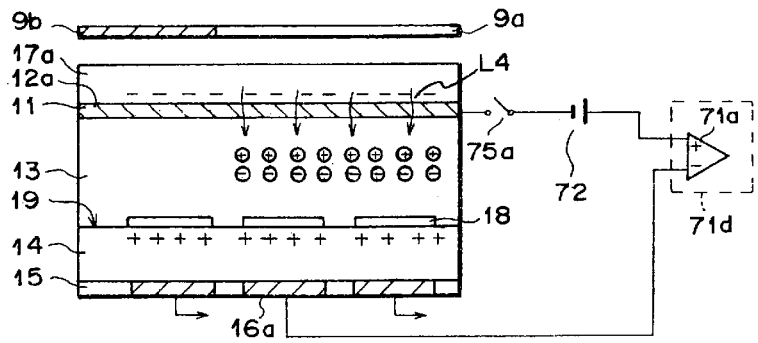
Figure 11D:
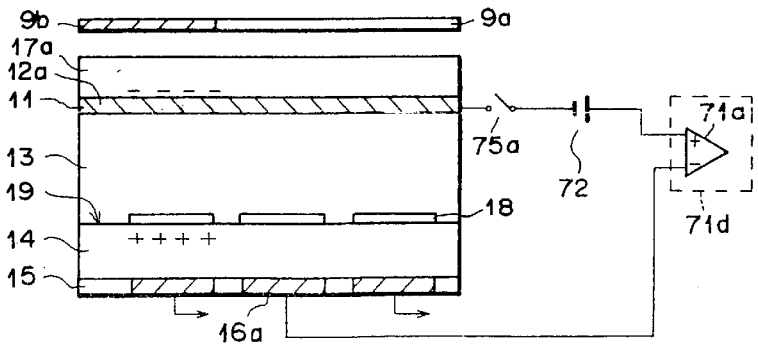

In the uniformly charged state shown in FIG. 11A, the application of voltage to the detector 10 is stopped and the subject 9 is exposed to radiation L1. The recording light L2 carrying the radiation image information of the subject 9, transmitted through the transmitting portion 9a of the subject 9, is irradiated to the side of the scintillator 17a of the detector 10. With the irradiation, the fluorescent light L4 with a light quantity corresponding to the dose of the recording light L2 is emitted from the scintillator 17a (FIG. 11B). The fluorescent light L4 emitted from the scintillator 17a is transmitted through the first electrode layer 11 and causes a pair of positive and negative charges with a quantity corresponding to the dose of the recording light L2 to be generated within the photoconductive layer 13 (FIG. 11C).

As with the case of using the detector 10 of the first embodiment, the positive charge of the generated charge pair transfers to the side of the first electrode layer 11 and disappears, recombining with the negative charge on the elements 12a of the first stripe electrode 12. Also, the negative charge transfers to the side of the charge storage portion 19 and disappears, recombining with the positive charge on the micro plates 18 (right side portion of the detector 10 of FIG. 11D).

On the other hand, since there is no possibility that the radiation irradiated to the non-transmitting portion 9b of the subject 9 will be transmitted through the subject 9, no fluorescent light is emitted from scintillator 17a corresponding to that portion. Therefore, the element 12a of the first stripe electrode 12 remains negatively charged and the micro plate 18 remains positively charged (left side portion of the detector 10 of FIG. 10C).

That is, while in the detector 10 of the first embodiment a pair of positive and negative charges are generated within the photoconductive layer 13 by direct irradiation of the recording light L2, the detector 10 of the second embodiment differs only in that a pair of positive and negative charges are generated within the photoconductive layer 13 by irradiation of the fluorescent light L4. In other words, there is no great difference in the process of recording an electrostatic latent image on the detector 10, except for a difference between the recording light L2 and the fluorescent light L4.

Figure 12A:
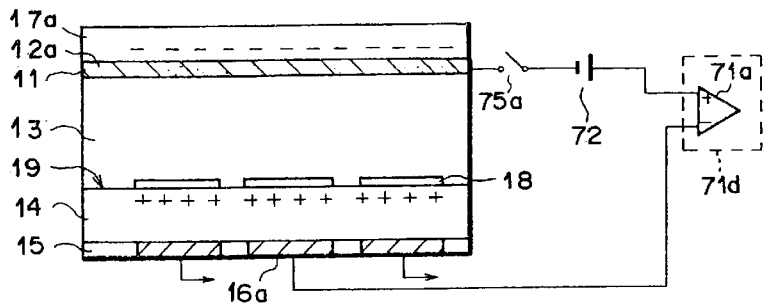
FIGS. 12A through 12D are circuit diagrams showing a charge model for the electrostatic latent image reading process used in the solid state radiation detector of the second embodiment when the recording light is irradiated through the side of a second electrode layer.

Next, for the case of irradiating the recording light L2 through the side of the second electrode layer 15, a description thereof will be given with reference to FIG. 12. Note that FIG. 12A is the same as FIG. 11A. In this case, the rectifying layer 14 and the micro plates 18 have permeability with respect to at least the recording light L2.

Figure 12B:
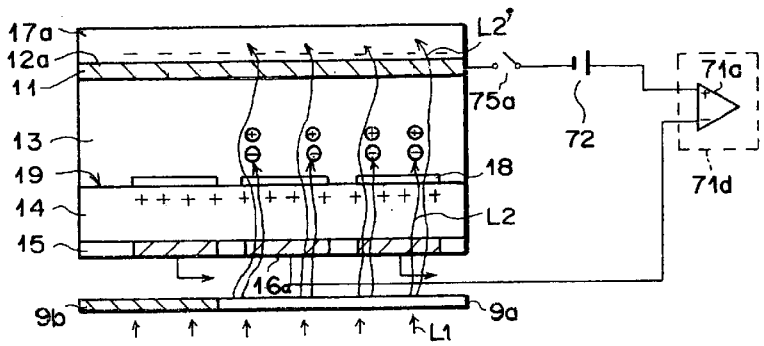

In the charged state shown in FIG. 12A, the application of voltage to the detector 10 is stopped and the subject 9 is exposed to radiation L1. The recording light L2 transmitted through the transmitting portion 9a of the subject 9 is irradiated to the side of the second electrode layer 15 of the detector 10. The recording light L2 is transmitted through the second electrode layer 15 and the rectifying layer 14 and causes a pair of positive and negative charges with a quantity corresponding to the dose of the recording light L2 to be generated within the photoconductive layer 13 (FIG. 12B).

Figure 12C:
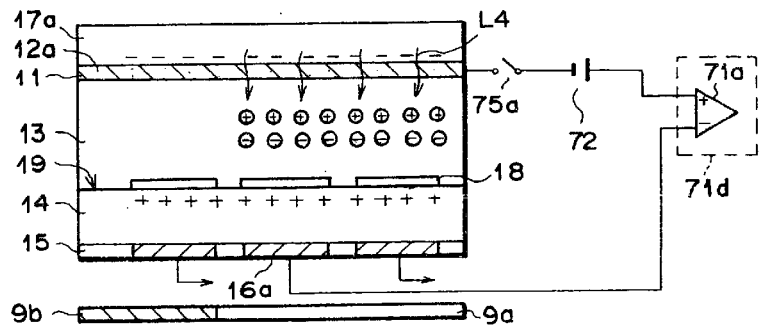
Figure 12D:
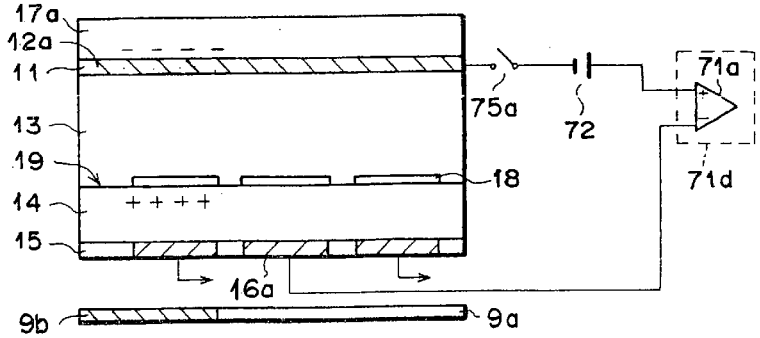

However, since the radiation absorption efficiency of the photoconductive layer 13 is not too high, part of the recording light L2 is transmitted through the photoconductive layer 13. The recording light L2' transmitted through the photoconductive layer 13 is transmitted through the first electrode layer 11 and incident on the scintillator 17a. With the incidence, the fluorescent light L4 with a light quantity corresponding to the dose of the recording light L2' is emitted from the scintillator 17a by excitation of the recording light L2'. The fluorescent light L4 emitted from the scintillator 17a is transmitted through the first electrode layer 11 and causes a pair of positive and negative charges with a quantity corresponding to the dose of the recording light L4 to be generated within the photoconductive layer 13 (FIG. 12C). The following process is the same as the above-mentioned case of irradiating the recording light L2 through the side of the scintillator 17a and therefore the electric charges on both the elements 12a and the charge storage portion 19 disappear (FIG. 12D).

Thus, the detector 10 of the second embodiment, which employs the scintillator 17a, is capable of generating a pair of positive and negative charges with greater efficiency within the photoconductive layer 13 not only by the recording light L2 but by the wavelength-converted fluorescent light L4. Therefore, while part of the recording light L2 used in the detector 10 of the first embodiment is transmitted through the photoconductive layer 13 without making a contribution to the storage of latent image charge, the second embodiment is capable of enhancing the generation efficiency of electric charge.

In addition, the generation efficiency of electric charge becomes higher in the case of irradiating the recording light L2 through the side of the second electrode layer 15 than in the case of irradiating it through the side of the scintillator 17a, because the radiation incidence side where the radiation absorption quantity of the scintillator 17a is great is adjacent to the photoconductive layer 13. That is, the generation efficiency of electric charge becomes higher in the disposition of the order of radiation source 90, scintillator 17a, and photoconductive layer 13 than in the disposition of the order of scintillator 17a, photoconductive layer 13, and radiation source 90, and the S/N ratio during reading is enhanced.

Furthermore, particularly in the case where the scintillator 17a employs cesium iodide (CsI), the radiation absorption rate can be made high. Therefore, even if the irradiation quantity of the recording light L2 is reduced, a large quantity of electric charge can be sufficiently stored and the radiation dose exposed to the subject 9 can be kept low.

While the detector 10 of the second embodiment is constructed such that the scintillator 17a is stacked on the outside of the first electrode layer 11, it may be stacked on the outside of the second electrode layer 15.

Figure 13A:
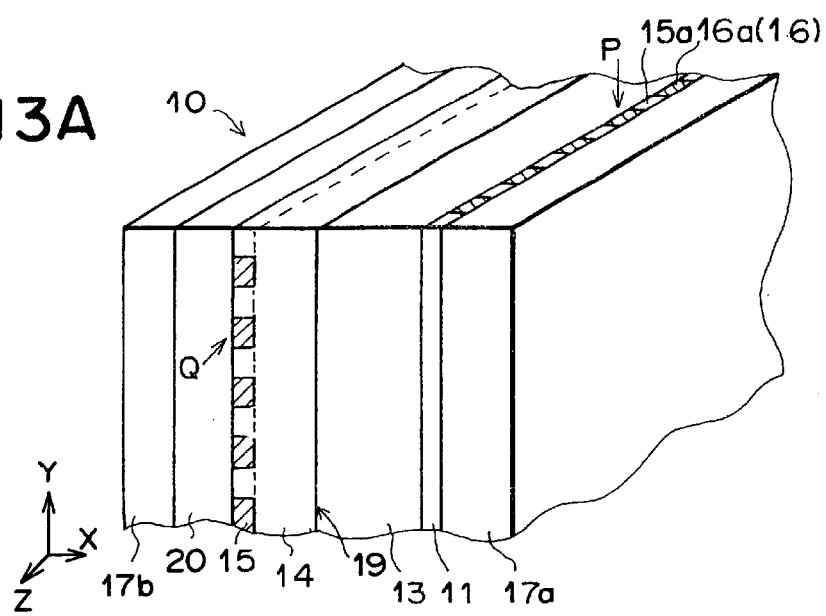
FIG. 13A is a perspective view showing a solid state radiation detector constructed according to a third embodiment of the present invention.
Figure 13B:
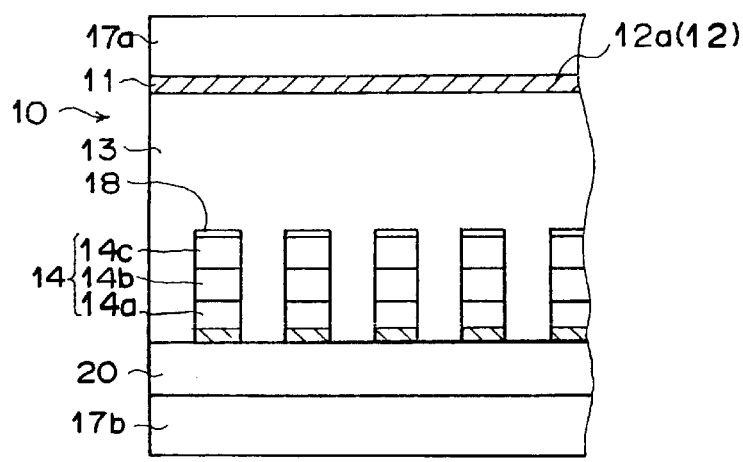
FIG. 13B is an XZ-section of the solid state radiation detector of FIG. 13A taken in a direction of arrow Q shown in FIG. 13A.
Figure 13C:
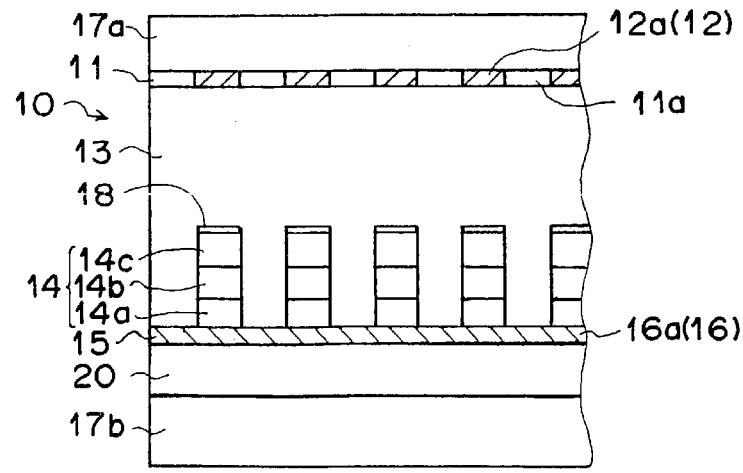
FIG. 13C is an XY-section of the solid state radiation detector of FIG. 13A taken in a direction of arrow P shown in FIG. 13A.

FIG. 13 illustrates a solid state radiation detector constructed according to a third embodiment of the present invention.

In the detector 10 of the third embodiment, a second scintillator 17b is further stacked on the outside of the second electrode layer 15 of the detector 10 of the above-mentioned second embodiment (in this embodiment on the outside of a glass substrate 20). The scintillator 17b emits fluorescent light L5 with a different wavelength from the wavelength of the recording light L2' by excitation of the recording light L2' transmitted through a photoconductive layer 13. Furthermore, a rectifying layer 14 and a second electrode layer 15 have permeability with respect to fluorescent light L5, and the photoconductive layer 13 exhibits photoconductivity when irradiated with fluorescent light L4 emitted from a first scintillator 17a and fluorescent light L5 emitted from the scintillator 17b.

In order for the rectifying layer 14 to have permeability with respect to the fluorescent light L5, it is preferable to employ α-Si (α-Si doped with carbon), or α-SiN (α-Si doped with nitrogen), as the substance of a p-type α-Si layer 14a, an intrinsic α-Si layer 14b, and an n-type α-Si layer 14c which form the rectifying layer 14. This is because, if α-Si is doped with C or N, the bandgap can be made greater and therefore the substance can have a greater absorption rate on the short wavelength side and have permeability with respect to green fluorescent light on the relatively long wavelength side. In addition to carbon and nitrogen, other known dopants may be employed as long as they make the bandgap greater so that absorption on the short wavelength side becomes greater.

Note that if α-SiC and α-SiN are doped with a slight amount of boron (B), they can be made p-type. Also, if they are doped with a slight amount of phosphorus, they can be made n-type.

Figure 14A:
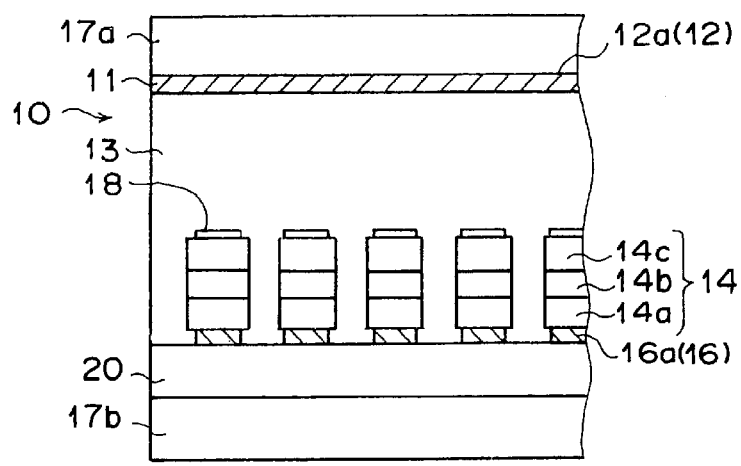
FIGS. 14A and 14B are diagrams showing a modification of the solid state radiation detector of the third embodiment.
Figure 14B:
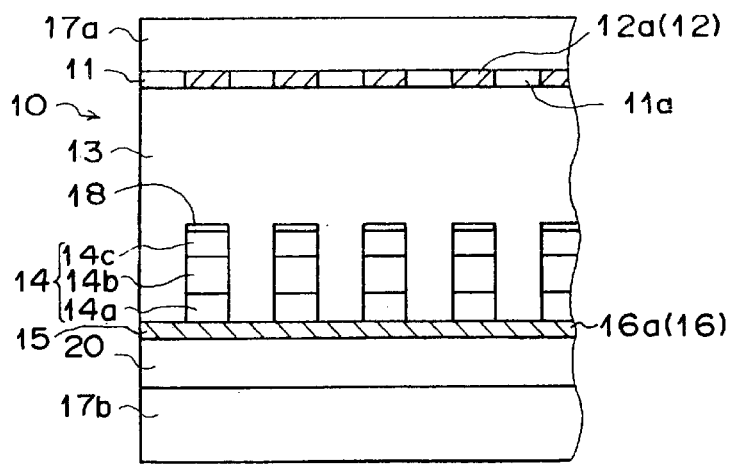

In addition, as shown in FIG. 14, the size of the diode 14d of the rectifying layer 14 may be etched so that it is approximately two-thirds or less of the smallest resolvable pixel size, and the gaps between diodes 14d may be filled with material having permeability with respect to the fluorescent light L5 emitted from the second scintillator 17b.

Note that the method of making the rectifying layer 14 have permeability with respect to the fluorescent light L5 can also be used as the method of making the rectifying layer 14 have permeability with respect to the recording light L2.

It is preferable that the micro plates 18 have permeability with respect to at least the fluorescent light L5 emitted from the second scintillator 17b and also use a known transparent conductive film such as an ITO film.

The appropriate substance of the photoconductive layer 13 is a photoconductive substance, having α-Si at its main ingredient, which exhibits photoconductivity with greater efficiency with respect to green light emitted from the scintillators 17a, 17b. It is preferable that the photoconductive layer 13 have a thickness such that the fluorescent light L4 and the fluorescent light L5 can be sufficiently absorbed.

It is preferable that the scintillators 17a, 17b have a high wavelength conversion efficiency. As described above, in the case where the photoconductive layer 13 uses a photoconductive substance having α-Si as its main ingredient, it is preferred to employ a scintillator having GOS, CsI: Tl, etc., as its main ingredients so that green light is emitted from the scintillators 17a, 17b.

For the electrostatic latent image recording process in the case of using the detector 10 of the third embodiment, a description thereof will be made with reference to a charge model shown in FIGS. 15 and 16. As with the case of using the detector 10 of the first embodiment, the negative charge (−) and positive charge (+), generated within the photoconductive layer 13 by the fluorescent light L4 emitted by excitation of the recording light L2, are represented by − and +, enclosed by ○. In FIGS. 15 and 16, the glass substrate 20 and the layer construction within the rectifying layer 14 are omitted for clarity. Because the uniformly charging process and the electrostatic latent image reading process are the same as the case of the detector 10 of the first embodiment, a description thereof will not be given.

Figure 15A:
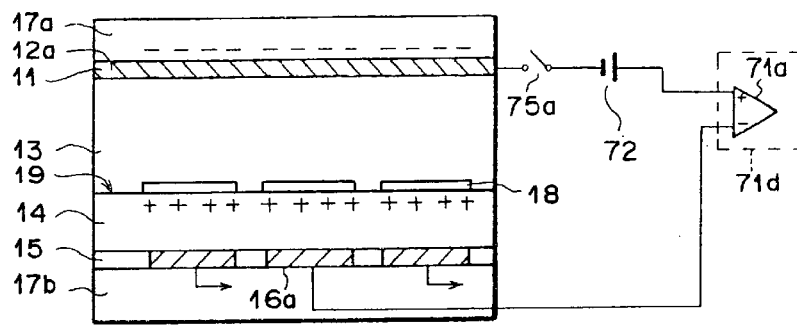
FIGS. 15A through 15D are circuit diagrams showing a charge model for the electrostatic latent image recording process in the case of using the solid state radiation detector of the third embodiment.

In the uniformly charged state shown in FIG. 15A, the application of voltage to the detector 10 is stopped and the subject 9 is exposed to radiation L1. The recording light L2 transmitted through the transmitting portion 9a of the subject 9 is irradiated to the side of the first scintillator 17a of the detector 10.

Figure 15B:
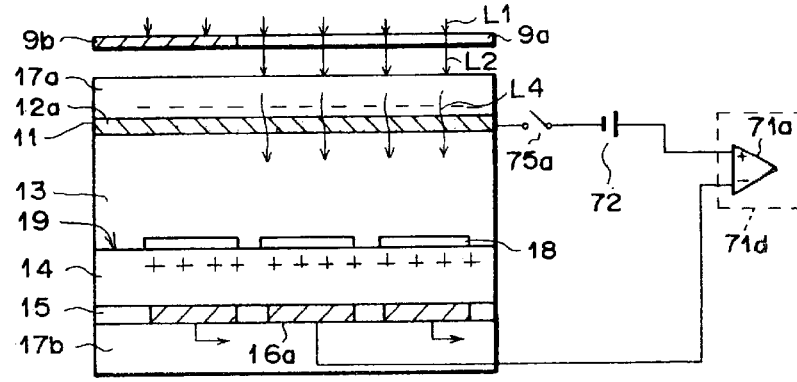
Figure 15C:
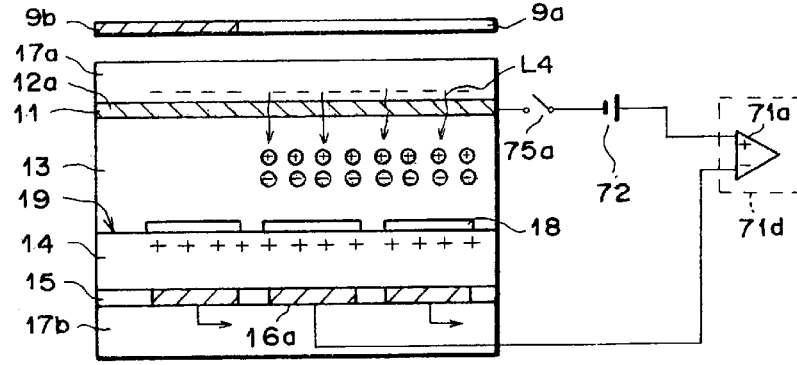
Figure 15D:
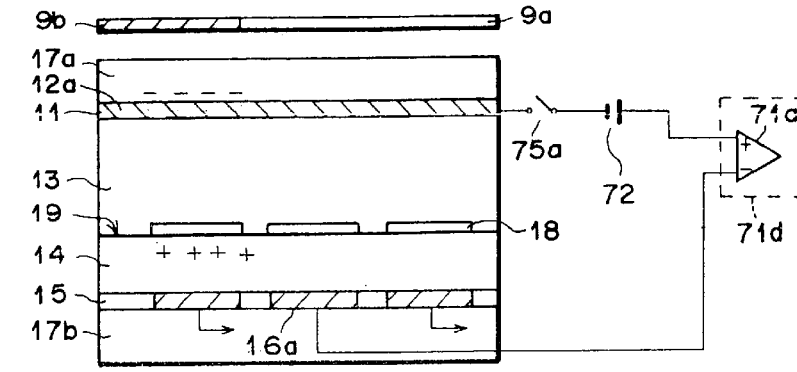

With the irradiation, the fluorescent light L4 with a light quantity corresponding to the dose of the recording light L2 is emitted from the first scintillator 17a (FIG. 15B). The fluorescent light L4 is transmitted through the first electrode layer 11 and causes a pair of positive and negative charges with a quantity corresponding to the light quantity of the fluorescent light L4 to be generated within the photoconductive layer 13 (FIG. 15C). The positive charge of the generated charge pair transfers to the side of the first electrode layer 11 and disappears, recombining with the negative charge on the elements 12a. Also, the negative charge transfers to the side of the charge storage portion 19 and disappears, recombining with the positive charge on the micro plates 18 (right side portion of the detector 10 of FIG.

15D). On the other hand, the element 12a facing the non-transmitting portion 9b of the subject 9 remains negatively charged, and the micro plate 18 facing the non-transmitting portion 9b remains positively charged (left side portion of the detector 10 of FIG. 15D). That is, the process up to this stage is the same as the process, in the detector 10 of the second embodiment, of irradiating the recording light L2 to the side of the scintillator 17 to record an electrostatic latent image.

Figure 16A:
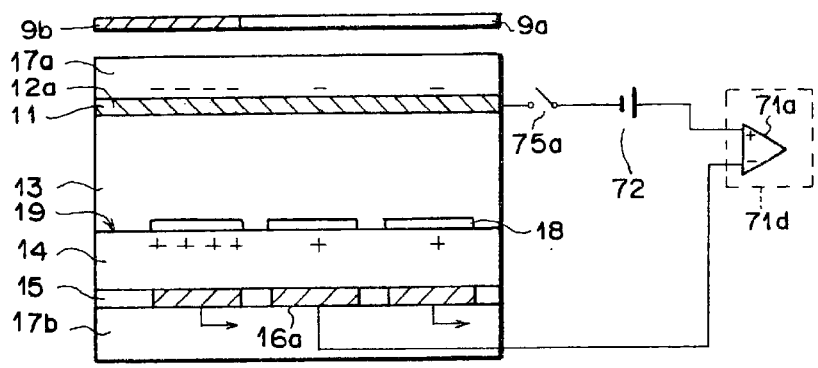
FIGS. 16A through 16D are circuit diagrams showing a charge model for the electrostatic latent image recording process in the case of using the solid state radiation detector of the third embodiment.

In the above-mentioned description, incidentally, it has been described that a pair of positive and negative charges are generated by the quantity that the electric charge on the elements 12a and the electric charge on the micro plates 18 of the charge storage portion 19 all disappear. However, the quantity of the charge pair that is actually generated is proportional to the intensity or dose of the recording light L2 incident on the detector 10. In addition, even with the intensity or dose being the same, the generation quantity of a charge pair varies depending on the conversion efficiency of the scintillator 17 or charge generation efficiency of the photoconductive layer 13. That is, the charge pair with a quantity that causes all the electric charges on the elements 12a and micro plates 18 of the detector 10 to disappear is not always generated in the photoconductive layer 13. Because of this, at portions corresponding to the transmitting portion 9a of the subject 9, some of the generated electric charges remain in the elements 12a and the micro plates 18a without recombination of positive and negative charges (FIG. 16A).

Figure 16B:
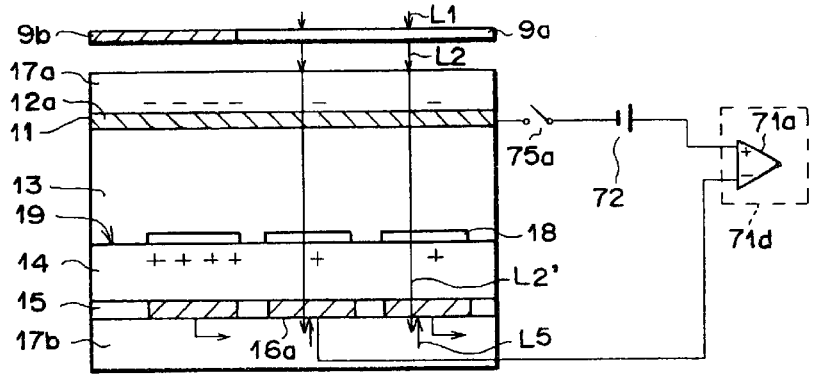
Figure 16C:
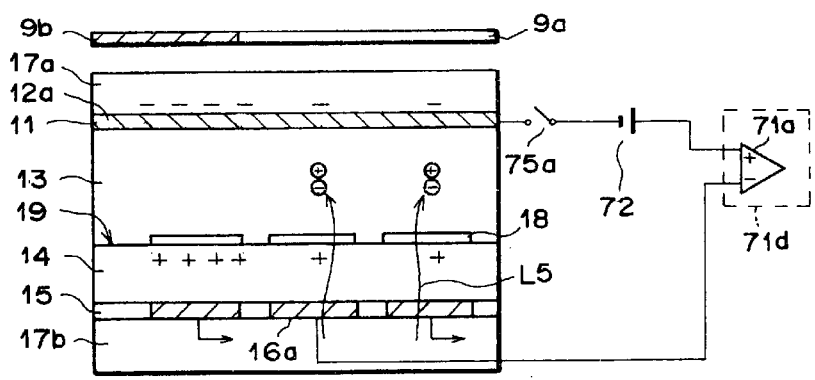
Figure 16D:
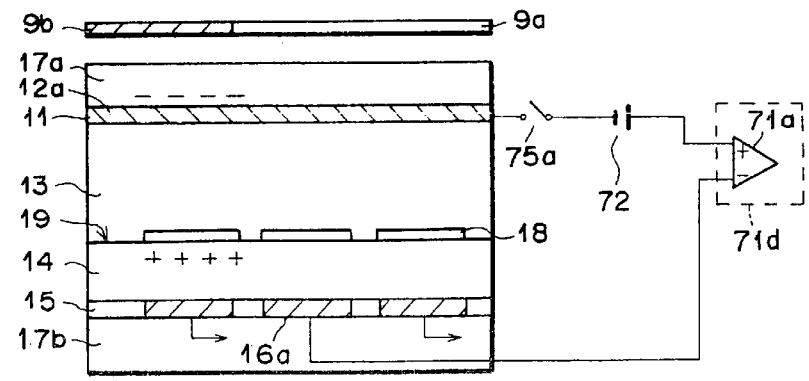

In addition, part of the recording light L2 is transmitted through the first scintillator 17a without being converted to fluorescent light L4 with in the scintillator 17a. The transmitted recording light L2' is transmitted through the first electrode layer 11, the photoconductive layer 13, the rectifying layer 14, and the second electrode layer 15, and excites the second scintillator 17b. With the excitation, fluorescent light L5 with a light quantity corresponding to the dose of the recording light L2' is emitted from the second scintillator 17b (FIG. 16B). The fluorescent light L5 is transmitted through the second electrode layer 15 and the rectifying layer 14 and causes a pair of positive and negative charges with a quantity corresponding to the light quantity of the fluorescent light L5 to be generated within the photoconductive layer 13 (FIG. 16C). The subsequent operation is the same as the above-mentioned operation for the fluorescent light L4, and the electric charges on the elements 12a and the charge storage portion 19 disappear in the same manner (FIG. 16D).

Thus, in the case of stacking the scintillators 17a, 17b on both sides of the detector 10, the recording light L2, transmitted through the scintillator stacked on the outside of one of the electrode layers of the detector 10, is converted to fluorescent light by the scintillator stacked on the other electrode layer, and it becomes possible to generate a pair of electric charges within the photoconductive layer 13 even by the fluorescent light emitted from the other scintillator. Therefore, the charge generation efficiency within the photoconductive layer 13 can be enhanced compared with the case of stacking a scintillator on the outside of either of the electrode layers, as in the detector 10 of the above-mentioned second embodiment. Therefore, an amount of current that can be fetched as a signal can be made larger and the S/N ratio during reading can be further enhanced.

While it has been described that the recording light L2 is irradiated through the side of the first scintillator 17a, it may be irradiated through the side of the second scintillator 17b. In this case, it is preferable that the micro plates 18 have permeability with respect to at least the fluorescent light L5 emitted from the second scintillator 17b and also use a known transparent conductive film such as an ITO film.

Note that the fast reading rate of the detector 10 of each embodiment and the application of a predetermined voltage between each of the elements 12a and all the element 16a will store uniform charges in the charge storage portion 19, i.e., charge the detector 10. Since this means that the detector 10 is practically returned to a recording start state, it is possible to perform real-time detection. For "the second stripe electrode 16 is caused to be in a recording state with voltage being released, after reading and charging," the elements 16a are switched in sequence, whereby real-time detection can be performed.

Here, in the case of the detection of a large pixel size that does not require high resolution, the number of pixels to be read can be reduced, by applying voltage to a plurality of elements 16a at the same time, or by performing a thinned-out read operation at intervals of several pixels, as described in Japanese Unexamined Patent Application No. 7(1995)-72258. With this reduction, the processing speed of the current detection circuit 70 connected to the detector 10, or the processing speed of the signal processing circuit connected behind the current detection circuit 70, can be decreased.

As a use that thus performs real-time detection, there is a fluoroscope that performs fluoroscopic photographing (dynamic image photographing) of the abdominal region, the heart, etc., as described in Japanese Unexamined Patent Application No. 7(1995)-72258, or computed tomography (CT) employing a conical beam, as described in Japanese Unexamined Patent Application No. 7(1995)-116154.

In addition, a desired photographing mode can be selected by switching fluoroscopic photographing, as real-time detection, and still-picture photographing. Shown in FIG. 17 is an example of a timing diagram in performing a thinned-out read operation during fluoroscopic photographing and also in switching fluoroscopic photographing and still-picture photographing. As shown in the figure, if a thinned-out read operation is performed, there is a difference in the response waveform of a quantity of residual charge between a line being read and a line not being read, during fluoroscopic photographing. However, since voltage is first applied from the power source 72 between both elements 12a and 16a for all lines to store uniform charges in the charge storage portion 19 during still-picture photographing, no problem will occur.

While the present invention has been described with reference to the preferred embodiments of the image detector, the method and unit for recording image information to the image detector, and the method and unit for reading out the recorded image information from the detector, the invention is not to be limited to the details given herein, but may be modified within the scope of the appended claims.

For example, while it has been described that the diode (rectifying device) 14d with the p-type α-Si layer 14a as its anode and the n-type α-Si layer 14c as its cathode is constructed in the rectifying layer 14, the direction of the diode may be reversed. In this case, the connections of the power source 72, etc., which constitute the current detection circuit 70, are changed according to the direction change in the diode.

In addition, while it has been described that the micro plates are provided between the photoconductive layer and the rectifying layer to form the charge storage portion satisfactorily, the present invention is not limited to this. Any construction may be adopted, if the charge storage portion for storing latent image charge can be formed inside the photoconductive layer or near the inside of the layer. For example, a known trapping layer for capturing and storing latent image charge representative of an electrostatic latent image (e.g., see U.S. Pat. No. 4,535,468), or a charge transfer layer which operates as substantially an insulator with respect to latent image charge and also operates as substantially a conductor with respect to an electric charge of the opposite polarity from the latent image charge (e.g., see Japanese Unexamined Patent Publication Nos. 10(1998)-232824 and 10(1998)-271374, filed by the applicant of this application), may be provided between the photoconductive layer and the rectifying layer. In the case of providing the trapping layer, latent image charge is held and stored within the trapping layer, or on the interface between the trapping layer and the photoconductive layer. On the other hand, in the case of providing the charge transfer layer, latent image charge is held and stored on the interface between the trapping layer and the photoconductive layer. In addition, the trapping layer or charge transfer layer may be provided and a plurality of micro conductive members, such as micro plates, be provided on the interface between the trapping layer (or charge transfer layer) and the photoconductive layer separately for each pixel.

Furthermore, although it has been described in the detectors 10 of the above-mentioned second and third embodiments that the scintillator is formed integrally in the detector, the present invention is not always limited to this. The scintillator and the detector may be separately formed. For instance, the scintillator is disposed on the front surface of the detector 10 during recording, and recording light is irradiated to the scintillator.

In addition, all of the contents of Japanese Patent Application Nos. 11(1999)-232673 and 2000-227253 are incorporated into this specification by reference.

What is claimed is:

1. An image detector, which has a charge storage portion for storing an electric charge with a quantity corresponding to the quantity of a recording electromagnetic wave irradiated, for recording image information on said charge storage portion as an electrostatic latent image, said image detector comprising:

a first electrode layer with a first stripe electrode including a large number of line electrodes;

a photoconductive layer which exhibits at least one of:
   photoconductivity when irradiated with said recording electromagnetic wave, and conversion of recording electromagnetic wave to light emitted by excitation of said recording electromagnetic wave by a scintillating device, said light having a wavelength differing from the wavelength of said recording electromagnetic wave;

a rectifying layer; and a second electrode layer with a second stripe electrode including a large number of line electrodes formed so as to cross said line electrodes of said first stripe electrode;

wherein said first electrode, said photoconductive layer, said charge storage portion, said rectifying layer, and said second electrode layer are stacked in the recited order.

2. The image detector as set forth in claim 1, wherein said rectifying layer is formed by disposing an n-type semiconductor, an insulator, and a p-type semiconductor in the recited order;

one of said n-type and p-type semiconductors, which is disposed on the side of said charge storage portion, is divided so as to correspond to pixel positions defined by said first and second stripe electrodes; and one of said n-type and p-type semiconductors, which is disposed on the side of said second electrode layer, is divided in stripe form so as to correspond to said second stripe electrode, or divided so as to correspond to said pixel positions.

3. The image detector as set forth in claim 1, wherein said charge storage portion is formed by conductive members which are provided separately in an electrically non-connected state for each of said pixel positions and cause said electric charge to be in the same electric potential state.

4. The image detector as set forth in claim 2, wherein said charge storage portion is formed by conductive members which are provided separately in an electrically non-connected state for each of said pixel positions and cause said electric charge to be in the same electric potential state.

5. The image detector as set forth in claim 1, wherein a scintillator, which emits light having a wavelength differing from the wavelength of said recording electromagnetic wave by excitation of said recording electromagnetic wave, is provided on the outside of said first electrode layer.

6. The image detector as set forth in claim 2, wherein a scintillator, which emits light having a wavelength differing from the wavelength of said recording electromagnetic wave by excitation of said recording electromagnetic wave, is provided on the outside of said first electrode layer.

7. The image detector as set forth in claim 3, wherein a scintillator, which emits light having a wavelength differing from the wavelength of said recording electromagnetic wave by excitation of said recording electromagnetic wave, is provided on the outside of said first electrode layer.

8. The image detector as set forth in claim 1, wherein said rectifying layer has permeability with respect to said recording electromagnetic wave, or with respect to light, emitted by excitation of said recording electromagnetic wave, which has a wavelength differing from the wavelength of said recording electromagnetic wave.

9. The image detector as set forth in claim 2, wherein said rectifying layer has permeability with respect to said recording electromagnetic wave, or with respect to light, emitted by excitation of said recording electromagnetic wave, which has a wavelength differing from the wavelength of said recording electromagnetic wave.

10. The image detector as set forth in claim 3, wherein said rectifying layer has permeability with respect to said recording electromagnetic wave, or with respect to light, emitted by excitation of said recording electromagnetic wave, which has a wavelength differing from the wavelength of said recording electromagnetic wave.

11. The image detector as set forth in claim 4, wherein said rectifying layer has permeability with respect to said recording electromagnetic wave, or with respect to light, emitted by excitation of said recording electromagnetic wave, which has a wavelength differing from the wavelength of said recording electromagnetic wave.

12. The image detector as set forth in claim 8, wherein said rectifying layer is formed of a material that has permeability with respect to said recording electromagnetic wave, or with respect to light, emitted by excitation of said recording electromagnetic wave, which has a wavelength differing from the wavelength of said recording electromagnetic wave.

13. The image detector as set forth in claim 1, wherein
said rectifying layer includes a large number of rectifying devices formed so that the size of each device is two-thirds or less of the smallest resolvable pixel size; and spaces between said rectifying devices are filled with a material that has permeability with respect to said recording electromagnetic wave, or with respect to light, emitted by excitation of said recording electromagnetic wave, which has a wavelength differing from the wavelength of said recording electromagnetic wave.

14. The image detector as set forth in claim 8, wherein a scintillator, which emits light having a wavelength differing from the wavelength of said recording electromagnetic wave by excitation of said electromagnetic wave, is provided on the outside of said second electrode layer.

15. The image detector as set forth in claim 12, wherein a scintillator, which emits light having a wavelength differing from the wavelength of said recording electromagnetic wave by excitation of said recording electromagnetic wave, is provided on the outside of said second electrode layer.

16. The image detector as set forth in claim 13, wherein a scintillator, which emits light having a wavelength differing from the wavelength of said recording electromagnetic wave by excitation of said recording electromagnetic wave, is provided on the outside of said second electrode layer.

17. A method of fabricating the image detector as set forth in claim 2, comprising the steps of:
forming a second electrode layer;
forming one of n-type and p-type semiconductors on said second electrode layer and then etching said one semiconductor so that it is disposed, facing a second stripe electrode;
forming an insulator on said etched one semiconductor;
forming the other of said n-type and p-type semiconductors on said insulator, and then etching said other semiconductor so that it faces said second stripe electrode and has desired pixel pitches and pixel widths in the longitudinal direction of said second stripe electrode;
forming a charge storage portion and a photoconductive layer on said etched other semiconductor in the recited order; and
forming an electrode member, which forms a first electrode layer, on said photoconductive layer and then etching said electrode member in stripe form so that said first stripe electrode is disposed, facing a position where said etched other semiconductor is disposed.

18. The method as set forth in claim 17, wherein said one semiconductor is etched so as to have desired pixel pitches and widths in the longitudinal direction of said second stripe electrode.

19. An image recording method of recording image information on a charge storage portion as an electrostatic latent image by irradiating a recording electromagnetic wave to the image detector as set forth in any one of claims 1 through 14 in order to store an electric charge with a quantity corresponding to the quantity of said recording electromagnetic wave in said charge storage portion, said image recording method comprising the steps of:
storing approximately uniform electric charge in said charge storage portion by applying a predetermined voltage between a first stripe electrode and a second stripe electrode; and
performing said recording, by stopping the application of said predetermined voltage and irradiating said recording electromagnetic wave to said image detector.

20. The image recording method as set forth in claim 19, further comprising the steps of:
disposing a scintillator, which emits light with a wavelength differing from the wavelength of said recording electromagnetic wave by excitation of said recording electromagnetic wave, so that it faces one of said first and second electrode layers; and
irradiating said recording electromagnetic wave to the other of said two electrode layers in which said scintillator is not disposed.

21. The image recording method as set forth in claim 20, wherein
using the image detector as set forth in claim 5;
disposing said scintillator only on the outside of one of said first and second electrode layers; and
irradiating said recording electromagnetic wave onto the other of said two electrode layers in which said scintillator is not disposed.

22. An image reading method of reading out image information from the image detector as set forth in any one of claims 1 through 14 in which said image information is recorded as an electrostatic latent image, said image reading method comprising the steps of:
applying a predetermined voltage between each line electrode, which constitutes a first stripe electrode, and all line electrodes, which constitute a second stripe electrode;
detecting a charging current which flows in the said image detector by the application of said predetermined voltage; and
obtaining an electrical signal with a level corresponding to the quantity of an electric charge stored in a charge storage portion, by the detection of the charging current.

23. An image recorder for recording image information on a charge storage portion as an electrostatic latent image by irradiating a recording electromagnetic wave to the image detector as set forth in any one of claims 1 through 14 in order to store an electric charge with a quantity corresponding to the dose of said recording electromagnetic wave in said charge storage portion, said image recorder comprising:
recording-voltage applying means for storing approximately uniform electric charge in said charge storage portion by applying a predetermined voltage between a first stripe electrode and a second stripe electrode; and
control means for controlling said recording-voltage applying means and the irradiation of said recording electromagnetic wave so that after the application of said predetermined voltage is stopped, said recording electromagnetic wave is irradiated to said image detector.

24. An image reader for reading out image information from the image detector as set forth in any one of claims 1 through 14 in which said image information is recorded as an electrostatic latent image, said image reader comprising:

- reading-voltage applying means for applying a predetermined voltage between each line electrode, which constitutes a first stripe electrode, and all line electrodes, which constitute a second stripe electrode; and
- image signal acquisition means for acquiring an electrical signal with a level corresponding to the quantity of an electric charge stored in a charge storage portion, by detecting a charging current which flows in the said image detector by the application of said predetermined voltage.

25. The image recording method as set forth in claim 20, wherein

- using the image detector as set forth in claim 14;
- disposing said scintillator only on the outside of one of said first and second electrode layers; and
- irradiating said recording electromagnetic wave onto the other of said two electrode layers in which said scintillator is not disposed.

* * * * *